United States Patent
Lowrey et al.

(10) Patent No.: US 7,092,286 B2
(45) Date of Patent: Aug. 15, 2006

(54) ELECTRICALLY PROGRAMMABLE MEMORY ELEMENT WITH REDUCED AREA OF CONTACT

(75) Inventors: Tyler Lowrey, San Jose, CA (US); Stephen J. Hudgens, Santa Clara, CA (US); Patrick Klersy, Lake Orion, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 11/221,627

(22) Filed: Sep. 8, 2005

(65) Prior Publication Data

US 2006/0006443 A1    Jan. 12, 2006

Related U.S. Application Data

(63) Continuation of application No. 09/813,267, filed on Mar. 20, 2001, now Pat. No. 6,943,365, which is a continuation-in-part of application No. 09/276,273, filed on Mar. 25, 1999, now Pat. No. 6,969,866, and a continuation-in-part of application No. 09/620,318, filed on Jul. 22, 2000, now abandoned, and a continuation-in-part of application No. 09/677,957, filed on Oct. 3, 2000, now Pat. No. 6,617,192.

(51) Int. Cl.
*G11C 11/00* (2006.01)
(52) U.S. Cl. ...................... 365/163; 365/148
(58) Field of Classification Search ................ 365/163, 365/148, 63; 257/3, 4, 5
See application file for complete search history.

(56) References Cited

U.S. PATENT DOCUMENTS

| | | | |
|---|---|---|---|
| 5,687,112 A * | 11/1997 | Ovshinsky ................... 365/163 |
| 5,854,102 A * | 12/1998 | Gonzalez et al. ............ 438/237 |
| 6,031,287 A * | 2/2000 | Harshfield ................... 257/734 |
| 6,423,621 B1 * | 7/2002 | Doan et al. .................. 438/597 |

* cited by examiner

*Primary Examiner*—Vu A. Le
(74) *Attorney, Agent, or Firm*—Philip H. Schlazer; Marvin S. Siskind

(57) ABSTRACT

A programmable resistance memory element having a conductive layer as an electrode. The conductive layer and memory material may have a small area of contact. In one embodiment, the conductive layer may be cup-shaped. In one embodiment, the memory element may include a chalcogenide material.

30 Claims, 33 Drawing Sheets

CHANNEL LENGTH

FIG - 2I'
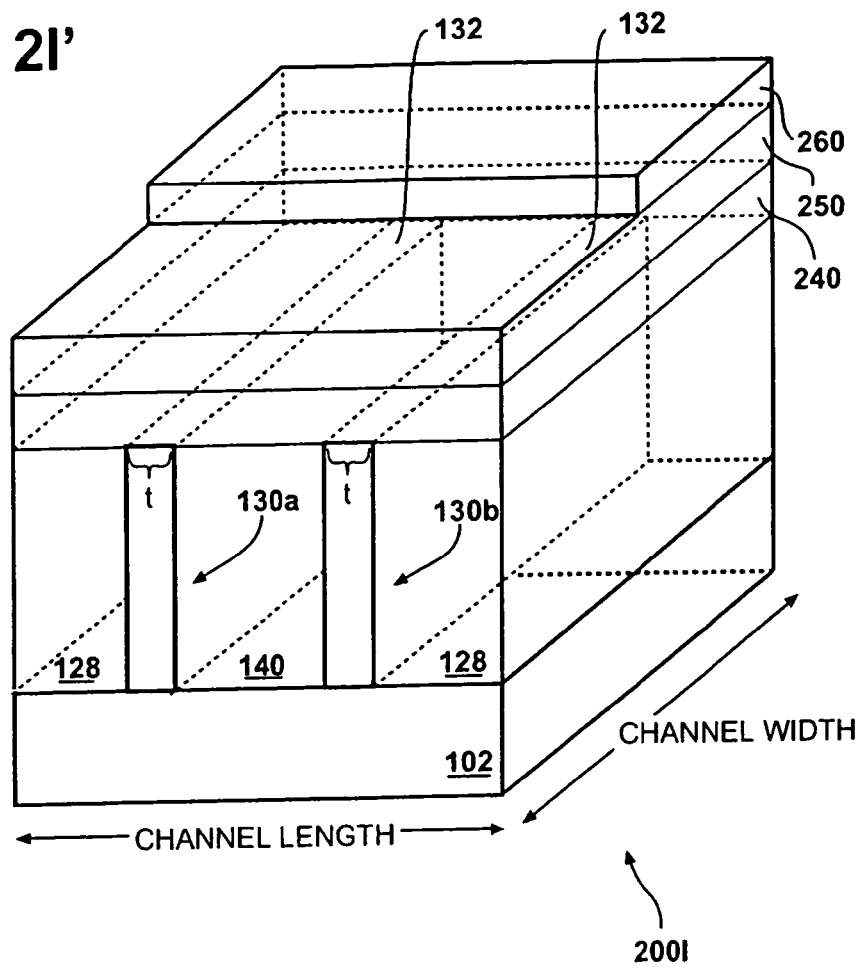
FIG - 2I"
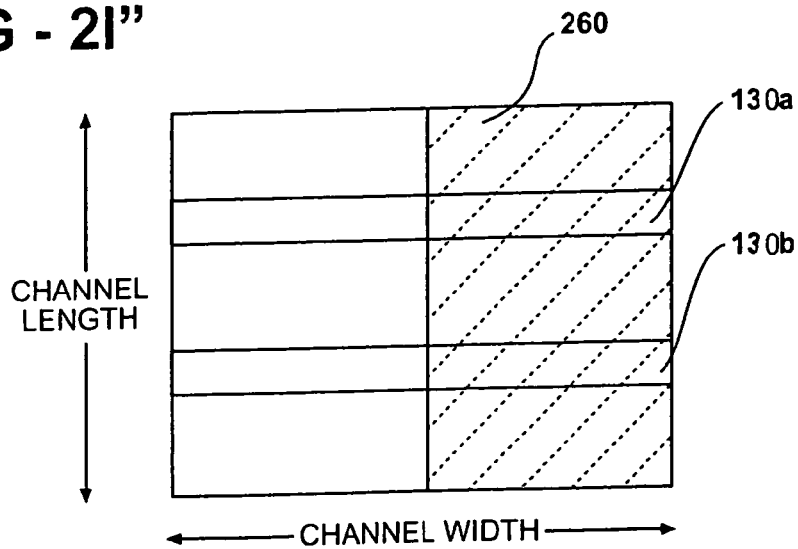

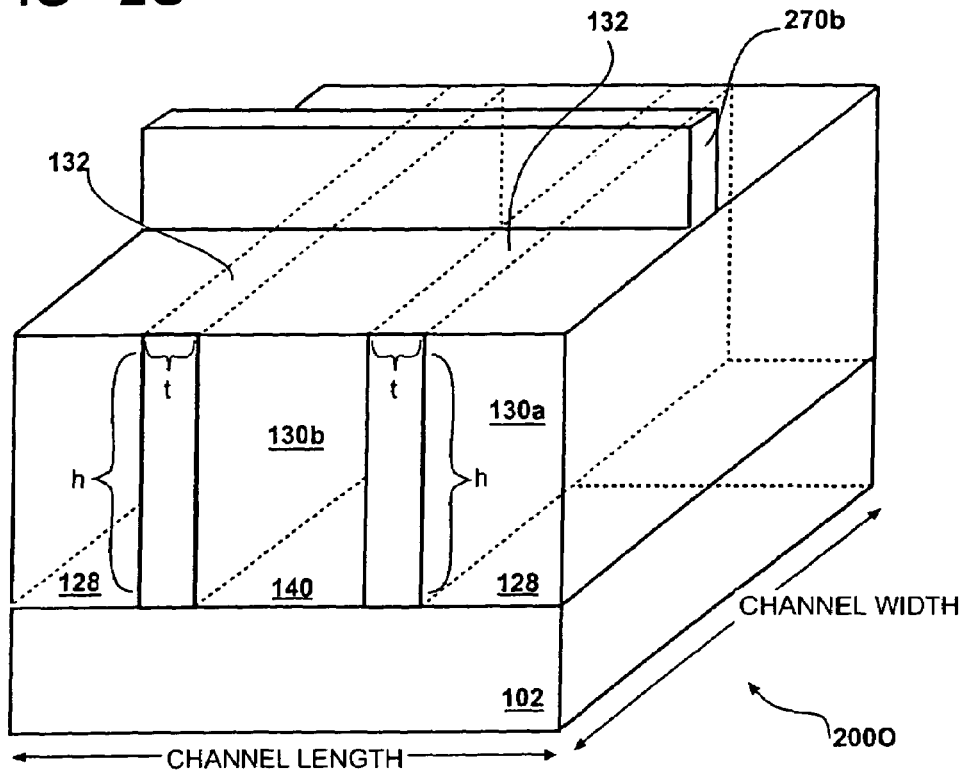
FIG - 20'
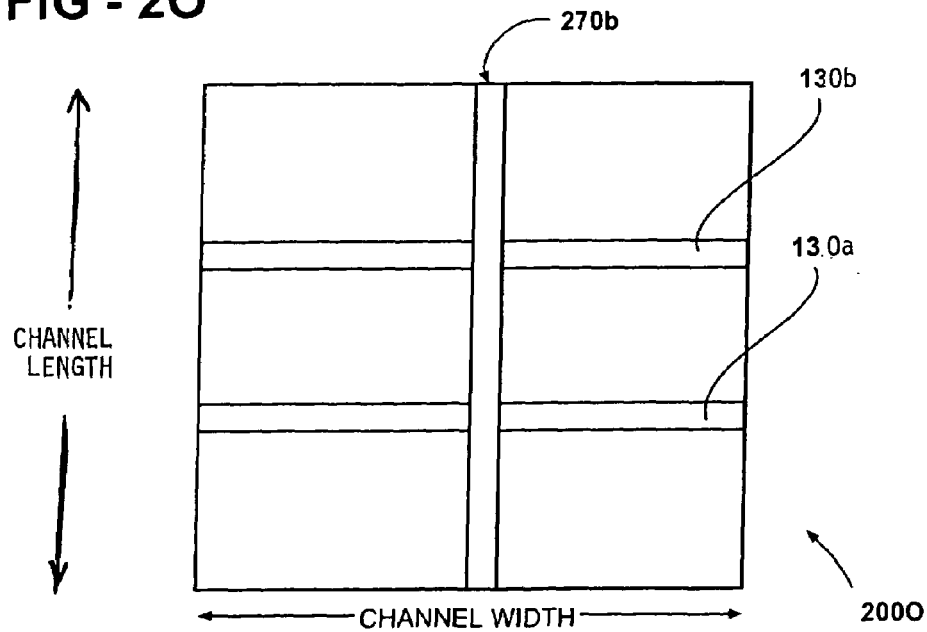
FIG - 20"

FIG - 6H"
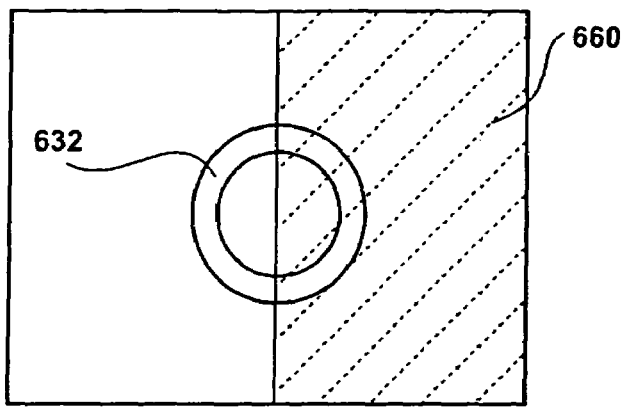
FIG - 6I
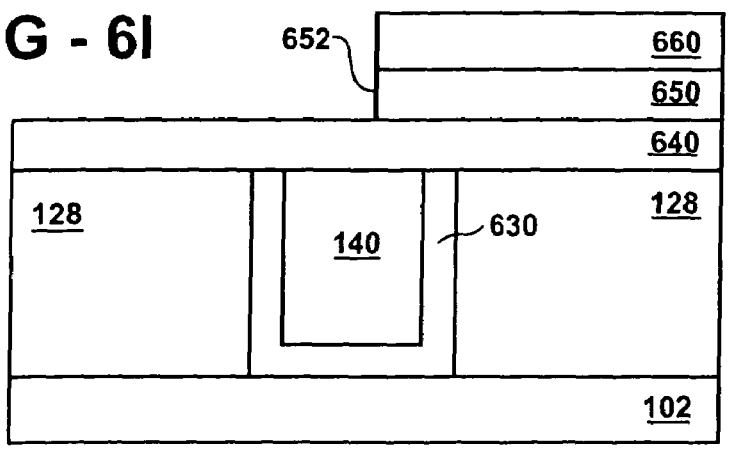
FIG - 6J
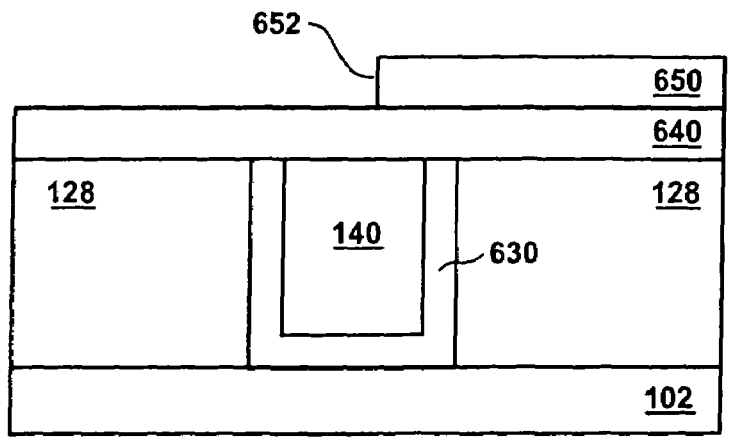

ELECTRICALLY PROGRAMMABLE MEMORY ELEMENT WITH REDUCED AREA OF CONTACT

RELATED APPLICATION INFORMATION

This application is a continuation of U.S. patent application Ser. No. 09/813,267, filed on Mar. 20, 2001 now U.S. Pat. No. 6,943,365. U.S. patent application Ser. No. 09/813,267 is a continuation-in-part of U.S. patent application Ser. No. 09/276,273, filed on Mar. 25, 1999 now U.S. Pat. No. 6,969,866. U.S. patent application Ser. No. 09/813,267 is a continuation-in-part of U.S. patent application Ser. No. 09/620,318, filed on Jul. 22, 2000 now abandoned. U.S. patent application Ser. No. 09/813,267 is a continuation-in-part of U.S. patent application Ser. No. 09/677,957 filed on Oct. 3, 2000 now U.S. Pat. No. 6,617,192. U.S. patent application Ser. No. 09/813,267 is hereby incorporated by reference herein.

FIELD OF THE INVENTION

The present invention relates generally to a uniquely designed solid state, electrically operated memory element. More specifically, the present invention relates to a new structural relationship between the electrical contacts and the memory material which are integral parts of the memory element.

BACKGROUND AND PRIOR ART

Programmable resistance memory elements formed from materials that can be programmed to exhibit at least a high or low stable ohmic state are known in the art. Such programmable resistance elements may be programmed to a high resistance state to store, for example, a logic ONE data bit. As well, they may be programmed to a low resistance state to store, for example, a logic ZERO data bit.

One type of material that can be used as the memory material for programmable resistance elements is phase change material. Phase change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The concept of utilizing electrically programmable phase change materials for electronic memory applications is disclosed, for example, in U.S. Pat. Nos. 3,271,591 and 3,530,441, the contents of which are incorporated herein by reference. The early phase change materials described in the '591 and '441 patents were based on changes in local structural order. The changes in structural order were typically accompanied by atomic migration of certain species within the material. Such atomic migration between the amorphous and crystalline states made programming energies relatively high.

The electrical energy required to produce a detectable change in resistance in these materials was typically in the range of about a microjoule. This amount of energy must be delivered to each of the memory elements in the solid state matrix of rows and columns of memory cells. Such high energy requirements translate into high current carrying requirements for the address lines and for the cell isolation/address device associated with each discrete memory element.

The high energy requirements for programming the memory cells described in the '591 and '441 patents limited the use of these cells as a direct and universal replacement for present computer memory applications, such as tape, floppy disks, magnetic or optical hard disk drives, solid state disk flash, DRAM, SRAM, and socket flash memory. In particular, low programming energy is important when the EEPROMs are used for large-scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the power consumption of the mechanical systems. In the case of lap-top computers, this is of particular interest because the mechanical hard disk drive is one of the largest power consumers therein. Therefore, it would be advantageous to reduce this power load, thereby substantially increasing the operating time of the computer per charge of the power cells. However, if the EEPROM replacement for hard drives has high programming energy requirements (and high power requirements), the power savings may be inconsequential or at best unsubstantial. Therefore, any EEPROM which is to be considered a universal memory requires low programming energy.

The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,414,271, 5,359,205, and 5,534,712 disclosures of which are all incorporated by reference herein.

The programming energy requirement may also be reduced through the appropriate modification of the electrical contacts used to deliver the programming energy to the memory material. For example, reduction in programming energy may be achieved by modifying the composition and/or shape and/or configuration (positioning relative to the memory material) of the electrical contacts. Examples of such "contact modification" are provided in U.S. Pat. Nos. 5,341,328, 5,406,509, 5,534,711, 5,536,947, 5,687,112, 5,933,365 all of which are incorporated by reference herein. Examples are also provided in U.S. patent application Ser. No. 09/276,273 the disclosure of which is incorporated herein by reference. Examples are also provided in U.S. patent application Ser. No. 09/620,318 the disclosure of which is incorporated herein by reference. More examples are provided in U.S. patent application Ser. No. 09/677,957 the disclosure of which is incorporated herein by reference. The present invention is directed to novel structures of a programmable resistance memory element and methods for making these structures.

SUMMARY OF THE INVENTION

One aspect of the present invention is an electrically operated memory element, comprising: a programmable resistance material; and a conductive layer in electrical communication with the memory material, the conductive layer having a raised portion extending from an edge of the layer to an end which is preferably adjacent the memory material. Also disclosed is an electrical contact for a semiconductor device, comprising: an insulative layer; an opening formed in the insulative layer, the opening having a sidewall surface and a bottom surface; and a conductive layer disposed on the sidewall surface of the opening, the layer having a raised portion extending from an edge of the conductive layer on the sidewall surface.

Another aspect of the present invention is a method for making a programmable resistance memory element, comprising: providing a conductive layer; forming a raised portion on an edge of the conductive layer; and depositing a programmable resistance memory material adjacent the raised portion.

Also disclosed is a method for making a programmable resistance memory element, comprising: providing a conductive sidewall layer; forming a raised portion on an upper edge of the conductive layer; and depositing a programmable resistance memory material adjacent the raised portion.

DETAILED DESCRIPTION OF THE INVENTION

The present invention is directed to programmable resistance memory elements. The memory element comprises a volume of memory material which is programmable between a first resistance state and a second resistance state in response to an electrical signal. The memory element further comprises a means of delivering the electrical signal to the volume of memory material. Preferably, the means of delivering the electrical signal comprises a first and a second electrical contact, also referred to as first and second electrodes, which are in electrical communication with the volume of memory material. The electrical contacts or electrodes do not have to be in physical contact with the memory material. (It is noted, that as used herein, the terminology "electrical contacts" and "electrodes" are synonymous and may be used interchangeably).

Figure 1A:
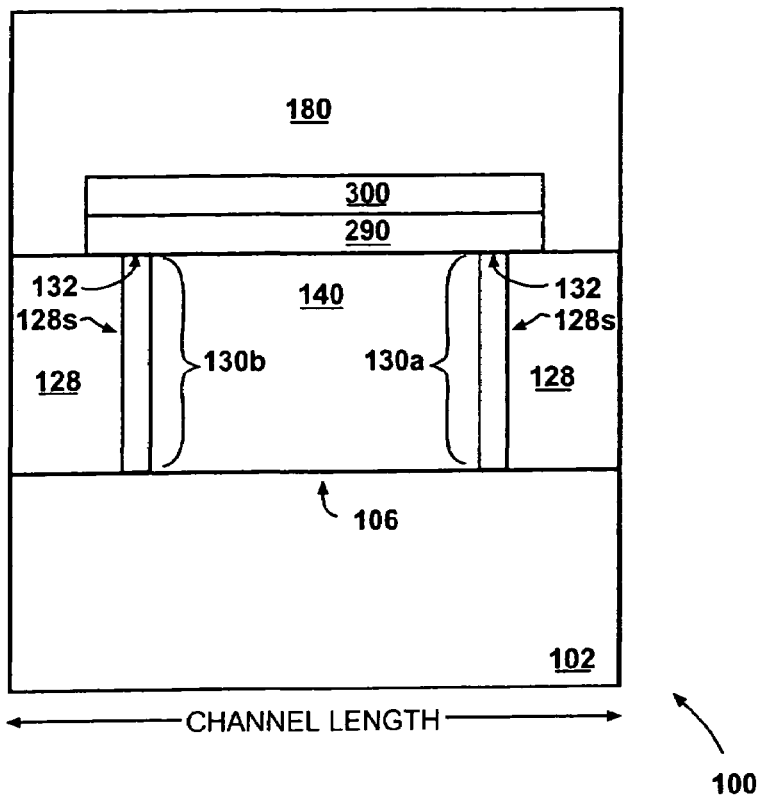
FIG. 1A is a cross sectional view of a memory device comprising conductive sidewall spacers as electrical contacts.

FIG. 1A is an cross-sectional view of a memory device 100 formed on a semiconductor substrate 102. The "channel length" of the memory device 100 is parallel to the plane of the illustration. The "channel width" of the memory device (not shown in FIG. 1A) is perpendicular to the plane of the illustration. In the example shown, the memory device 100 comprises two independent memory elements. The first memory element comprises a first electrical contact 130A (a bottom electrode), a layer of memory material 290 and a second electrical contact 300 (a top electrode). The second memory element comprises a first electrical contact 130B (a bottom electrode), a layer of memory material 290 and a second electrical contact 300 (a top electrode).

In the example shown, the volume of memory material is a substantially horizontally disposed layer of memory material 290. The memory material 290 and the second electrical contact 300 are shared by the first and second memory elements. However, other embodiments are possible where each memory element has a separate volume (or layer) of memory material and a separate second electrical contact. Dielectric regions 140 and 128 may be formed of silicon dioxide. Region 140 electrically isolates the bottom electrical contact 130A from the bottom electrical contact 130B. An upper dielectric region 180 is deposited on top of the memory device 100. The upper dielectric layer 180 may comprise boron-phosphate silica glass (BPSG). Reference to the electrical contact 130A,B refers to either electrical contact 130A or electrical contact 130B.

Each of the electrical contacts 130A and 130B shown in FIG. 1A is a conductive layer. More specifically, each is a conductive sidewall layer in the form of a conductive sidewall spacer. A conductive sidewall layer may be formed by the substantial conformal deposition of a conductive material onto a sidewall surface. In FIG. 1A, sidewall surfaces 128S and bottom surface 106 form a trench extending perpendicular to the plane of the illustration.

In the example shown in FIG. 1A, each conductive spacer 130A,B is "edgewise adjacent" to the memory material. That is, only edge 132 or a portion of edge 132 of conductive spacer 130A,B is adjacent to the memory material 290. The remainder of the conductive spacer is remote to the memory material. Hence, substantially all electrical communication between the conductive spacer 130A,B and the memory material 290 occurs through all or a portion of edge 132. It is noted that edge 132 does not have to be in actually physical contact with the memory material. Also, in an alternate configuration it is possible to position the layer 290 of memory material so that it is adjacent to an edge of only one of the conductive spacers.

Figure 1B:
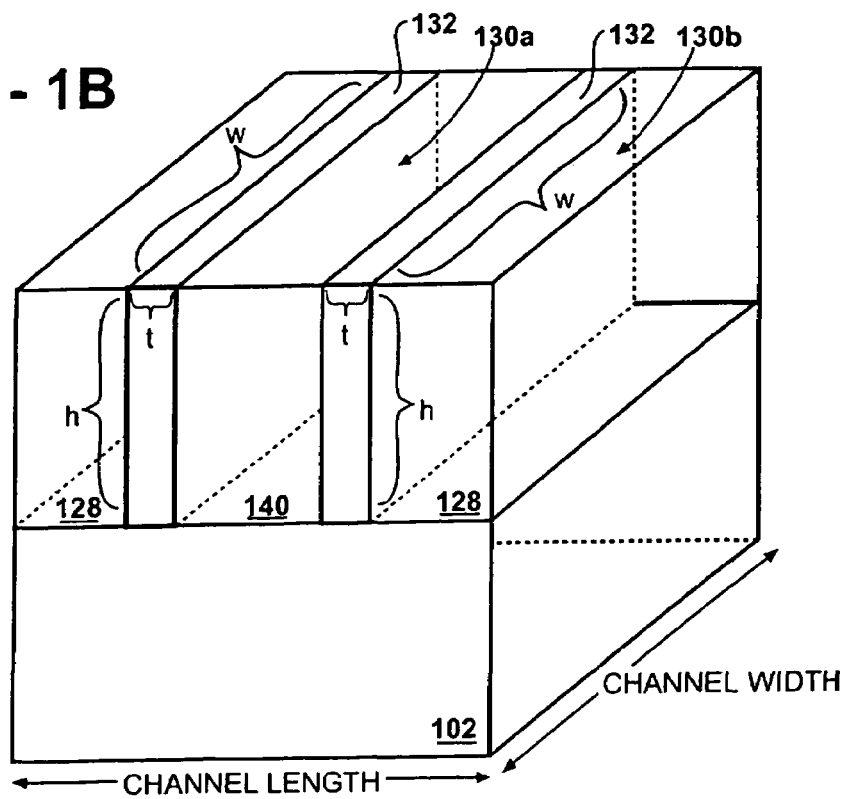
FIG. 1B is a three-dimensional view of the conductive sidewall spacers shown in FIG. 1A.

FIG. 1B is an three-dimensional representation of conductive spacers 130A,B showing their thickness "t", width "w" and height "h". The thickness "t" of the conductive sidewall spacer 130A,B is the dimension of the spacer along the channel length (parallel to plane of the illustration). The thickness "t" of conductive sidewall spacer 130A,B may have a dimension which is smaller than what is producible by conventional photolithography. The width "w" is the dimension of the conductive spacer along the channel width (perpendicular to the plane of the illustration of FIG. 1A). The height "h" is the distance above the substrate 102.

As used herein the "area of contact" is the portion of the surface of an electrical contact through which the electrical contact electrically communicates with the memory material. While not wishing to be bound by theory it is believed that reducing the size of the area of contact reduces the volume of the memory material programmed, thereby reducing the total current needed to program the memory device.

As noted, in the embodiment shown in FIG. 1A, substantially all electrical communication between the memory material 290 and conductive sidewall spacer 130A,B occurs through all or a portion of edge 132. Hence, the area of contact between the conductive spacer 130A,B and the memory material 290 is an edge of the conductive sidewall spacer or a portion of an edge of the conductive sidewall spacer. The area of contact is thus very small and is proportional to the thickness of the conductive spacer adjacent to the memory material.

Figure 1C:
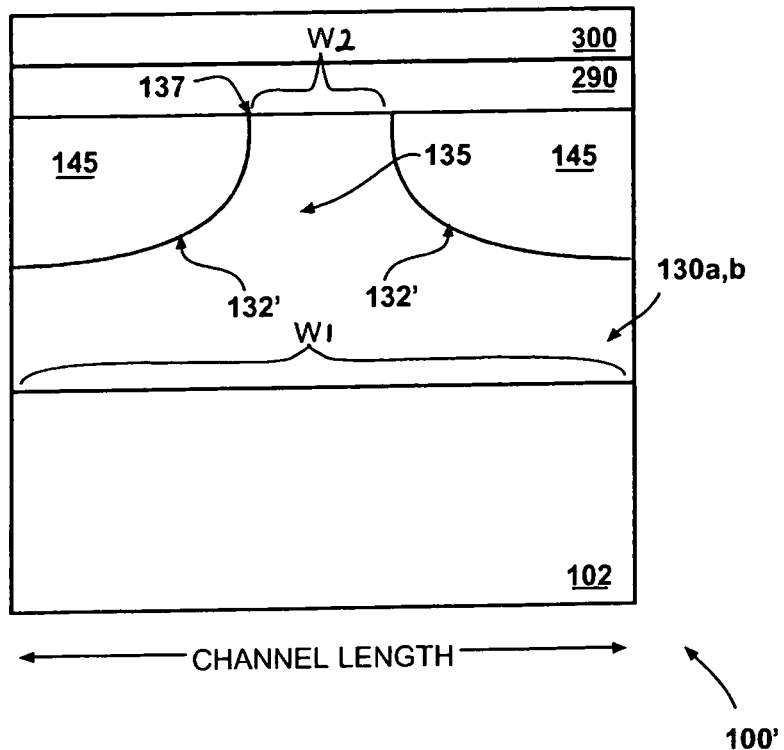
FIG. 1C is a cross-sectional view, parallel to the channel width, of a memory element using conductive sidewall spacers with rapier modification.
Figure 1D:
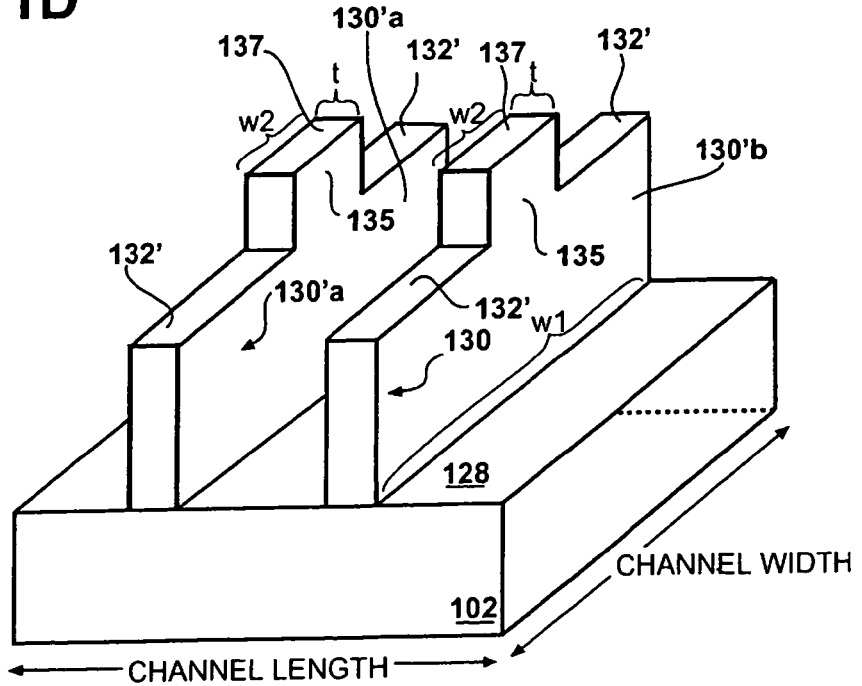
FIG. 1D is a three-dimensional view of conductive sidewall spacers with rapier modification.

The area of contact may be reduced even further. In FIGS. 1A and 1B, each conductive sidewall layer 130A,B has a substantially uniform width "w". In order to further decrease the area of contact between each conductive sidewall spacer 130A,B and the memory material, each conductive sidewall spacer may be formed so that its width is reduced (i.e., the conductive spacer is made narrower) adjacent to the memory material. Reducing the width "w" of the sidewall spacer adjacent the memory material reduces the area of contact between the conductive spacer and the memory material. This embodiment, referred to as a "rapier" design of the conductive spacer, is shown in FIG. 1C. FIG. 1C is a cross-sectional view of a memory device 100' using a conductive sidewall spacer 130'A,B with a rapier design. The plane of the illustration is parallel to the channel width of the memory device 100'. As shown, the top edge 132 of the conductive sidewall spacer has been appropriately etched so that its width is reduced adjacent to the memory material. In particular, each conductive spacer has been appropriately recessed to form a protrusion or raised portion 135 adjacent to the memory material. The raised portion 135 extends from the recessed edge 132' to an upper (or distal) end or surface 137 adjacent the memory material 290. The upper surface 137 of the raised portion 135 is also referred to as the "tip" or "peak" of the raised portion. FIG. 1D is a three-dimensional representation of the conductive layers 130'A,B having raised portions 135 that extend from the edges 132'. The top surface or tip 137 of each of the raised portions has a thickness "t" and a width "w2". The thickness "t" is the thickness of the conductive layer 130'A,B adjacent to the memory material (not shown). Preferably, thickness "t" is less than about 750 Angstroms, more preferably less than about 500 Angstroms and most preferably less than about 300 Angstroms. The width "w2" of the raised portion 135 adjacent the memory material is substantially less than the width "w1" of the sidewall layer 130'A,B adjacent the substrate 102. Preferably, the width "w2" is less than 700 Angstroms, more preferably less than 600 Angstroms and most preferably less than about 500 Angstroms. The thickness "t", the width "w2" as well as the surface area of the tip 137 may all be made smaller than what is permitted by photolithographic techniques. Preferably, the dimensions of the top surface 137 are sufficient so that the area of contact between the raised portion 135 and the memory material is preferably less than about 0.005 micron$^2$, more preferably less than about 0.0025 micron$^2$, and most preferably less than about 0.0015 micron$^2$.

The raised portion 135 may be made to have substantially vertical sidewalls (for example, substantially uniform width "w2" and substantially uniform thickness "t"), or it may be made to taper as it extends toward the tip 137 (for example, by tapering the width "w2 and/or by tapering the thickness "t"). Generally, the shape of the raised portion 137 is not limited to any particular shape. Examples of possible shapes include conical, pyramidal, prismatic and wedge-shaped frustums. The top surface or tip 137 of the raised portion 135 may be substantially flat or rounded. It is also conceivable that the top end or tip 137 may also be sharpened. The height of the raised portion 135 as well as the extent of any tapering may be controlled.

Referring again to FIG. 1C, a dielectric material 145 is preferably positioned between the conductive sidewall layer 130'A,B and the memory material so that only the top surface 137 is exposed and in electrical contact with the memory material. Hence, substantially all electrical communication between each conductive layer 130'A,B and the memory material occurs through the top surface or tip 137 of the raised portion 135. The area of contact between each bottom electrode 130'A,B and the memory material is thus preferably the top surface or tip 137. As noted above, in one embodiment of the invention it is preferable that the area of contact has an area less than about 0.005 micron$^2$, more preferably less than about 0.0025 micron$^2$, and most preferably less than about 0.0015 micron$^2$.

In an alternate embodiment of the invention, it is possible that the raised portion 135 be made to protrude into the memory material so that more of the surface of the raised portion 135 is in electrical contact with the memory material. It is noted that more than one raised portion may be formed on the edge 132' of each conductive layer 130'A,B.

The raised portions 135 may be made by forming an oxide or nitride spacer over the conductive sidewall layers 130A,B shown in FIG. 1B. Specifically, the oxide or nitride spacer is positioned above the conductive sidewall layers 130A,B where it is desired to position the raised portions 135. The oxide or nitride spacer serves as a mask for either an anisotropic or isotropic etch. That is, the exposed sections of the edges 132 of the sidewall layers will be etched away and recessed while the section underlying the mask is protected from the etch so as to form raised portions or protrusions that extend from the recessed edges.

Figure 2A:
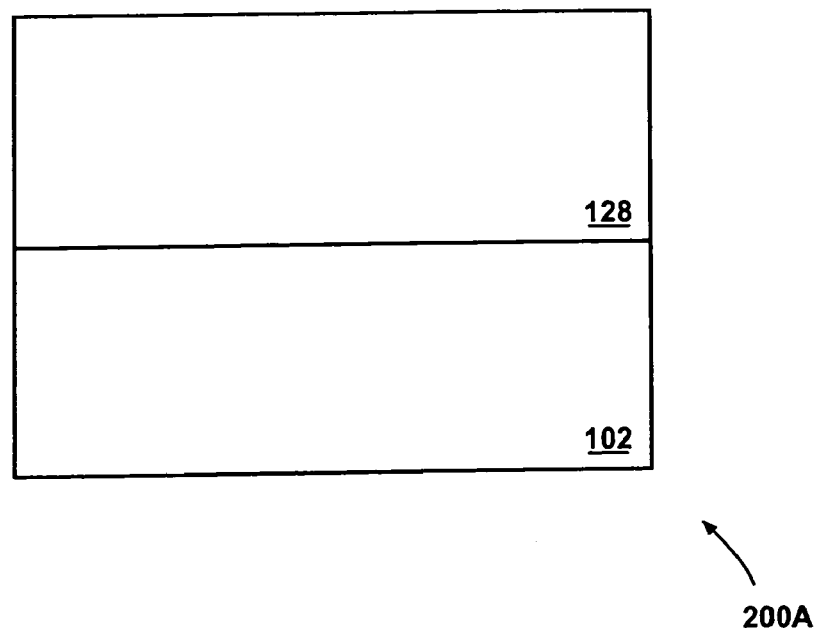
FIGS. 2A–2S shows a process for making the memory element of FIG. 1C.

An embodiment of a method for fabricating the memory device 100' of FIG. 1C is shown in FIGS. 2A–2T. Referring first to FIG. 2A, a substrate 102 is provided and a dielectric layer 128 is deposited on top of the substrate 102 to form the structure 200A shown in FIG. 2A. The dielectric layer 128 may be a dielectric material such as silicon dioxide $SiO_2$ which may be deposited by means such as chemical vapor deposition (CVD).

Figure 2B:
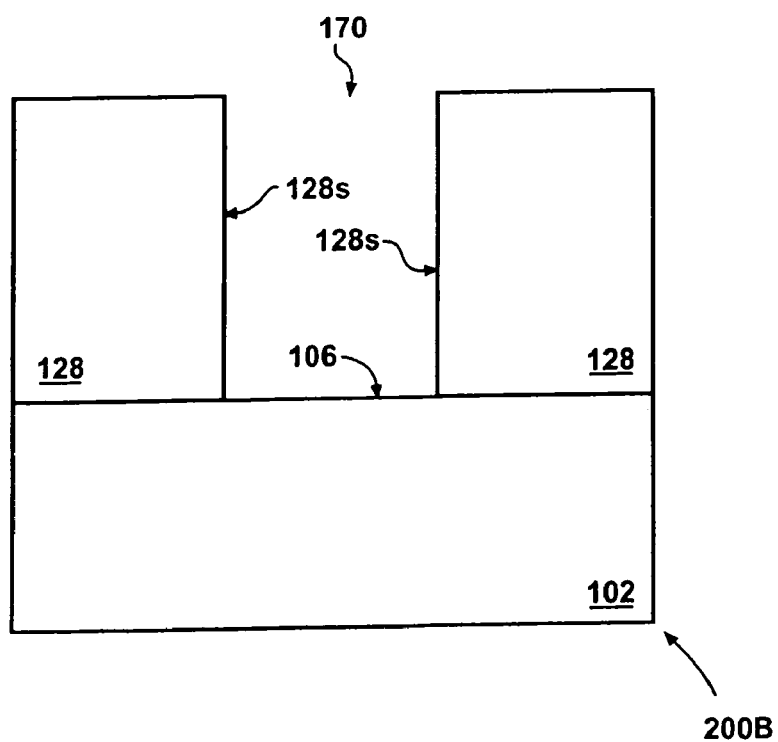

Referring to FIG. 2B, the dielectric layer 128 is then appropriately masked and etched to form a window or opening in the dielectric layer 128. In the embodiment shown in structure 200B, the opening is a trench 170 which runs perpendicular to the plane of the illustration. The trench 170 has sidewall surfaces 128S (corresponding to the sidewall surfaces of the dielectric regions 128) and bottom surface 106.

Figure 2C:
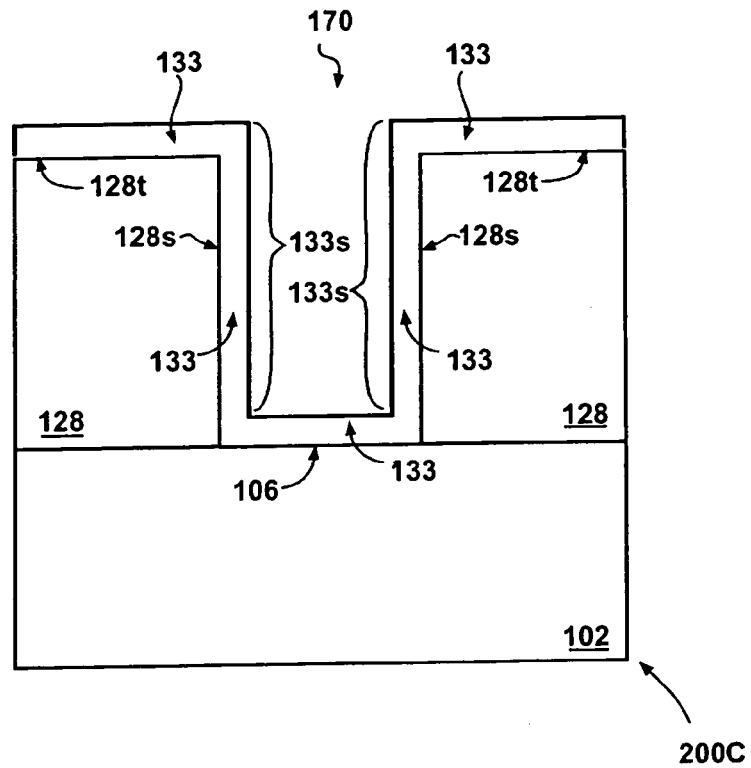

A layer 133 of a conductive material is deposited onto the structure 200B to form the structure 200C shown in FIG. 2C. Preferably, the deposition is a substantially conformal deposition. The layer 133 is deposited onto the top surfaces 128T of the dielectric regions 128, onto the sidewall surfaces 128S of the dielectric regions 128, and onto the bottom surface 106 of the trench 170. Hence, portions of the layer 133 are deposited along the two sidewall surfaces 128S of the trench 170. These portions of the layer 133 are sidewall layer portions 133S of the layer 133. The conformal deposition of layer 133 may be done using chemical vapor deposition techniques. Other possible deposition methods may be used as long as the sidewall surfaces 128S are appropriately covered by the layer 133.

Generally, the material 133 may be any conductive material. Examples of materials which may be used for layer 133 are include, but are not limited to, n-type doped polysilicon, p-type doped polysilicon, p-type doped silicon carbon alloys and/or compounds, n-type doped silicon carbon alloys and/or compounds, titanium-tungstem, tungsten, tungsten silicide, molybdenum, and titanium nitride. Other examples include titanium carbon-nitride, titanium aluminum-nitride, titanium silicon-nitride, and carbon.

The n-type polysilicon may be formed "in situ" by depositing polysilicon in the trench 170 using a CVD process in the presence of phosphene. Alternately, the n-type polysilicon may be formed by first depositing polysilicon and then doping the polysilicon with phosphorous or arsenic. P-type doped polysilicon may be formed by first depositing polysilicon and then doping the polysilicon with boron.

After the layer 133 is conformally deposited it is then anisotropically etched. The anisotropic etch removes those sections of the layer 133 which are substantially horizontally disposed and leaves those sections which are substantially vertically disposed. Specifically, the anisotropic etch removes the substantially horizontally disposed sections of the layer 133 that were deposited on top surfaces 128T of the regions 128. It also removes the substantially horizontally disposed section of the layer 133 deposited onto the bottom surface 106 of trench 170. The anisotropic etch leaves those sections of the layer 133 conformally deposited along the sidewall surfaces 128S. Hence, the anisotropic etch leaves the sidewall layer portions 133S of the layer 133. The results of the anisotropic etch are shown as structure 200D in FIG. 2D. The sidewall layer portions 133S of layer 133 form the conductive sidewall spacers 130A,B.

Assuming that the layer 133 conformally coats the surfaces onto which it is deposited, the conductive sidewall spacers 130A,B will have a lateral thickness substantially equal to the selected thickness of the layer 133. Preferably, the layer 133 is deposited so that the resulting conductive sidewall spacers 130A,B have a substantially uniform thickness between about 50 and about 1000 Angstroms, and more preferably between about 100 and about 500 Angstroms. It is noted that the thickness of the sidewall spacers 130A,B may be made to have a dimension which is less than that permitted by conventional photolithographic techniques.

Figure 2D:
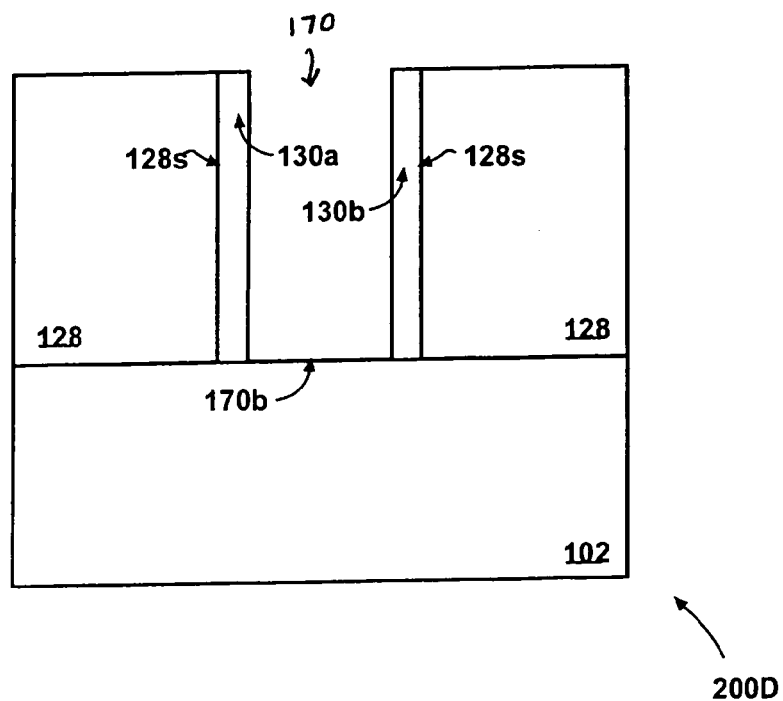

The conductive sidewall spacers 130A,B shown in FIG. 2D extend continuously along the width of the trench 170 (i.e perpendicular to the plane of the illustration of FIG. 2D). The next step in the process is to mask and etch the conductive sidewall spacers 130A,B so as to form a plurality of individual conductive sidewall spacers along the width of the memory array. These conductive spacers define individual memory elements along the channel width of the memory array.

Figure 2E:
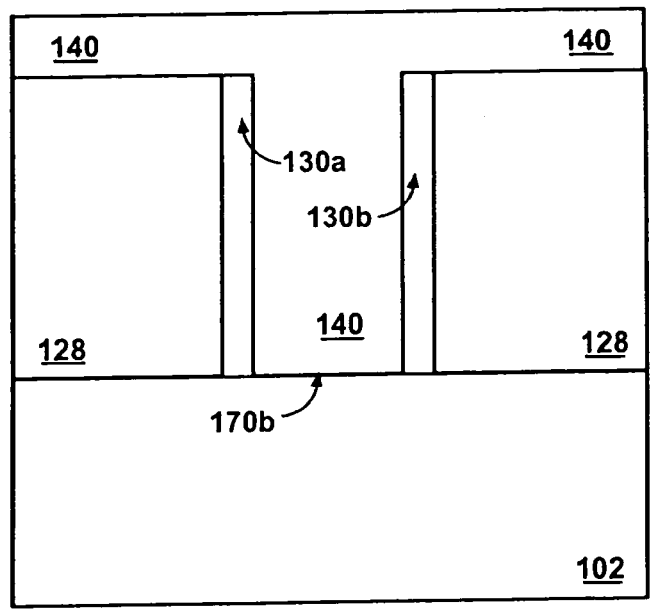
Figure 2F:
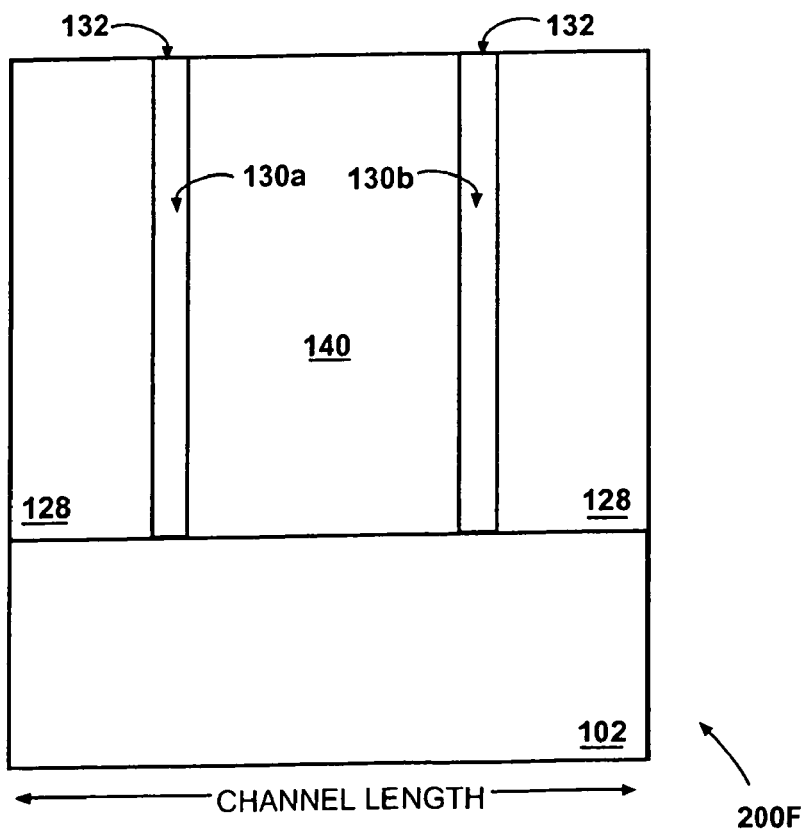
Figure 2F:
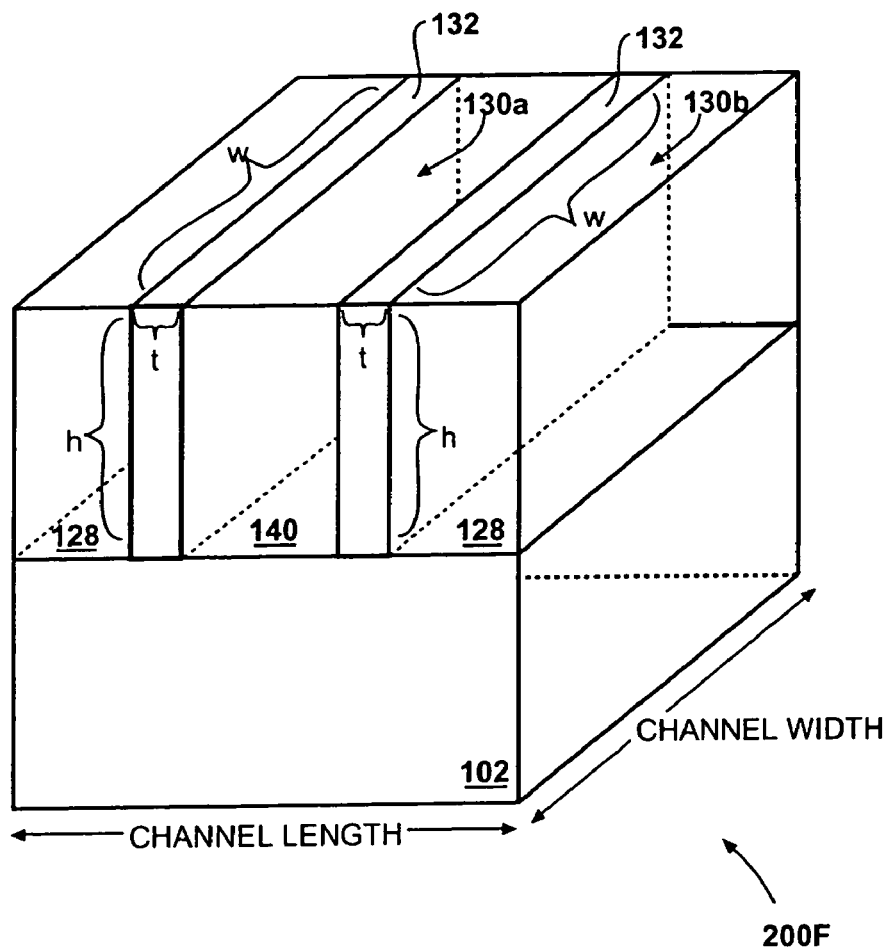

The opening 170 is then filled with a dielectric material such as silicon dioxide $SiO_2$. This may be done by depositing the dielectric material 140 onto the trench 170 and on top of the dielectric layers 128 of structure 200D to form structure 200E that is shown in FIG. 2E. The deposition may be done using a chemical vapor deposition process. The structure 200E may then chemically mechanically polished (CMP) or dry etched to form the structure 200F shown in FIG. 2F. The chemical mechanical polishing or dry etching preferably planarizes the top surfaces of the sidewall layers 130A,B to form substantially planar top edges 132 (as shown in FIG. 2F). A three dimensional representation of the structure 200F is shown in FIG. 2F'.

Figure 2G:
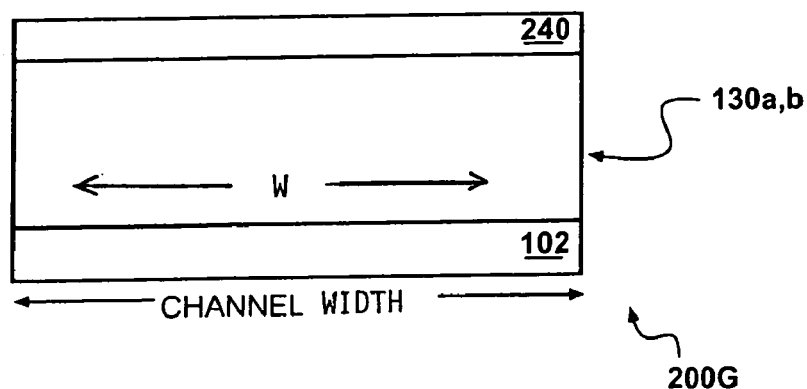
Figure 2G:
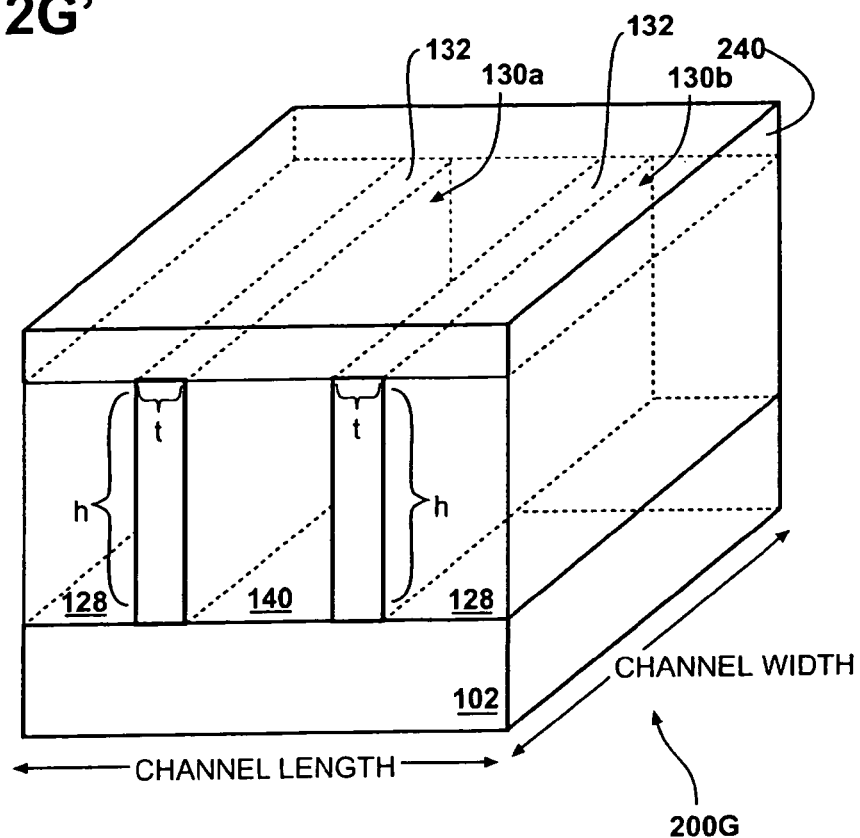
Figure 2H:
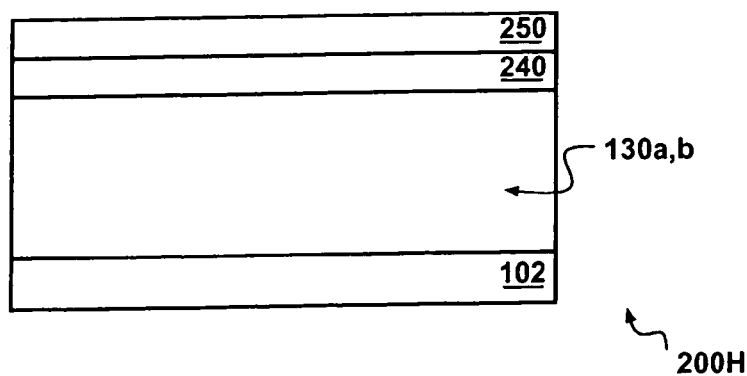
Figure 2H:
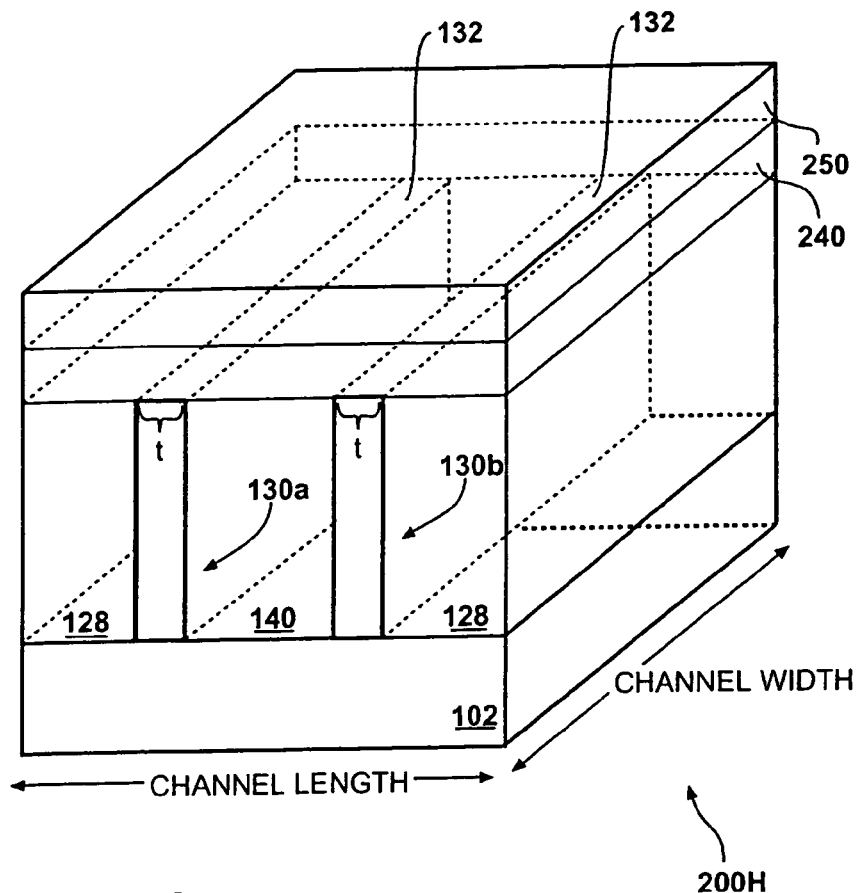

A first oxide layer 240 (for example, silicon dioxide from a TEOS source) is deposited onto the top surface of structure 200F to form the structure 200G shown in FIG. 2G (cross-sectional view with channel width parallel to the plane of the illustration) and FIG. 2G' (a three-dimensional representation). Preferably, the dimension of the first oxide layer 240 is between about 200 Angstroms and 500 Angstroms, and more preferably about 300 Angstroms. The first oxide layer 240 may be deposited using a chemical vapor deposition process. A layer 250 of polysilicon is deposited on top of the oxide layer 240 to form structure 200H shown in FIGS. 2H and 2H'. Preferably, the dimension of layer 250 is approximately 1000 Angstroms.

Figure 2I:
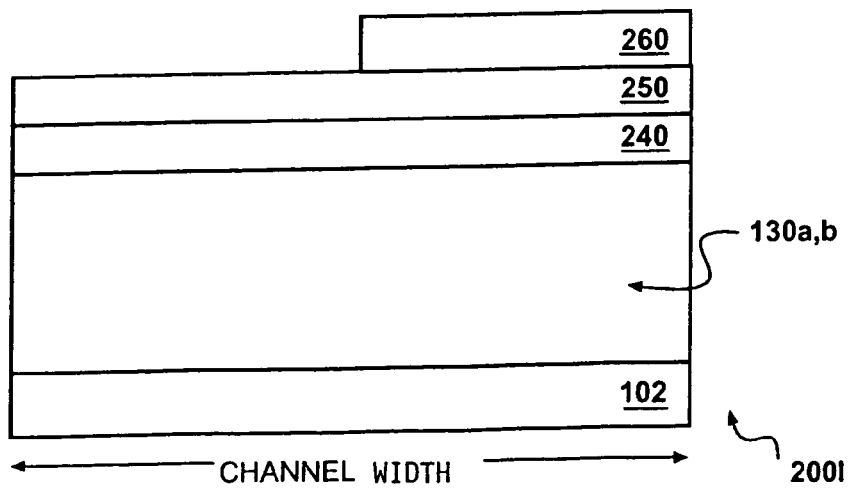

The structure 200H is then appropriately masked and etch. A layer of photoresist material 260 is applied on top of the layer of polysilicon 250. The layer of photoresist is appropriately patterned (i.e., a pattern on a mask is transferred to the layer of photoresist) to form the patterned layer of photoresist 260 shown in FIG. 2I and FIG. 2I'. A top view of the patterned photoresist 260 relative to the top edges of the conductive layers 130A,B is shown in FIG. 2I".

Figure 2J:
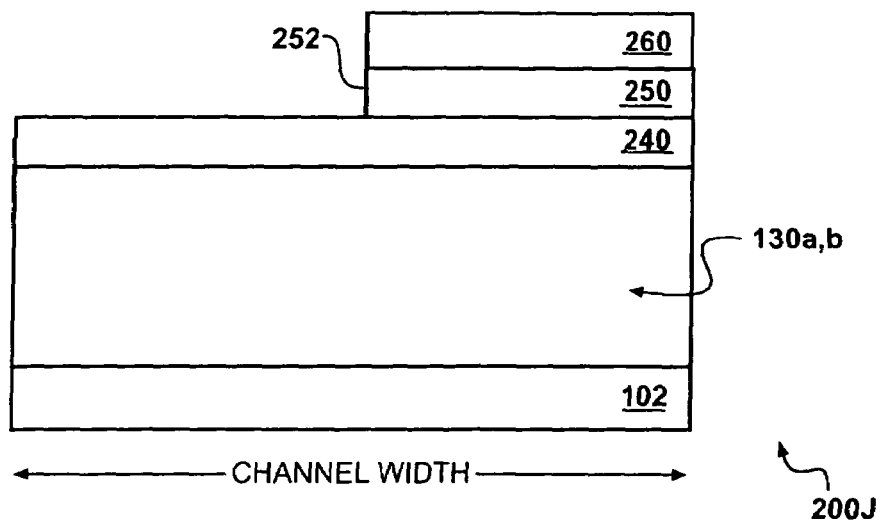
Figure 2K:
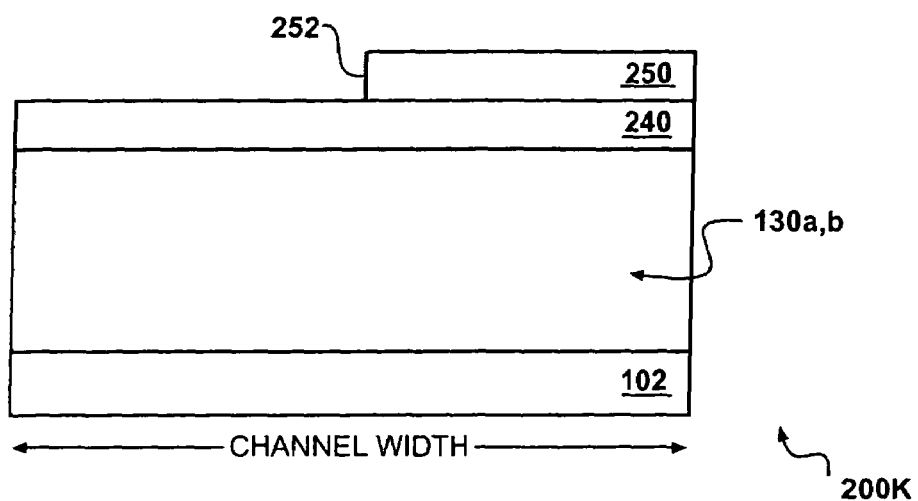

The structure 200I is then dry etched to remove the portion of the polysilicon layer 250 which is not protected by the photoresist 260, thereby forming the structure 200J shown in FIG. 2J. The etch used is selective to the oxide. The etch forms a sidewall surface 252 to the polysilicon layer 250. The photoresist 260 is then stripped from structure 200J to form structure 200K shown in FIG. 2K.

Figure 2L:
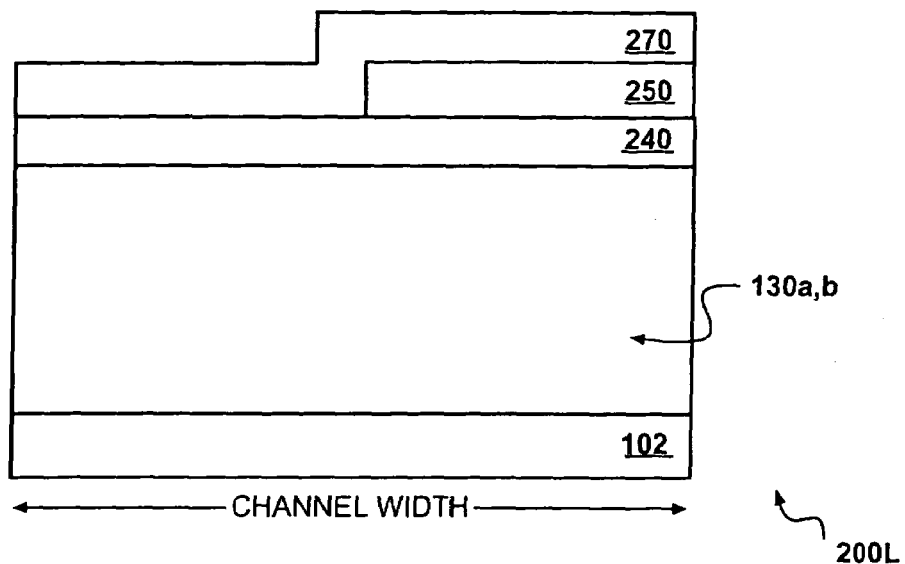

A second oxide layer 270 (such as silicon dioxide) is then deposited onto the structure 200K to form the structure 200L shown in FIG. 2L. Preferably, the layer 270 is deposited to a thickness of about 600 Angstroms. The second oxide layer 270 is deposited onto the horizontal surfaces of the polysilicon layer 250 as well as the first oxide layer 240. It is also deposited along the sidewall surface 252 of the polysilicon layer 250. The oxide layer 270 is then anisotropically etched to remove the horizontally disposed portions of second oxide layer 270 and leave the vertically disposed portion along the sidewall 252. The resulting structure is shown as structure 200M in FIG. 2M. The remaining portion the oxide layer 270 is the portion 270A.

The remaining portion of the polysilicon layer 250 shown in FIG. 200M is then removed. This is preferably done by using a polysilicon dry etch. It is possible to use a wet polysilicon etch as well. The resulting structure is shown as structure 200N in FIG. 2N. After this, the structure 200N is subjected to an anisotropic etch to remove the horizontally disposed portions of the first oxide layer 240, leaving the oxide spacer 270B as shown by structure 200 O in FIG. 2 O. A three dimensional representation of the structure 200 O is shown in FIG. 2 O'. A top view of the oxide spacer 270B and its positioning relative to the top surfaces 132 of the conductive layers 130A,B is shown in FIG. 2 O''.

Figure 2M:
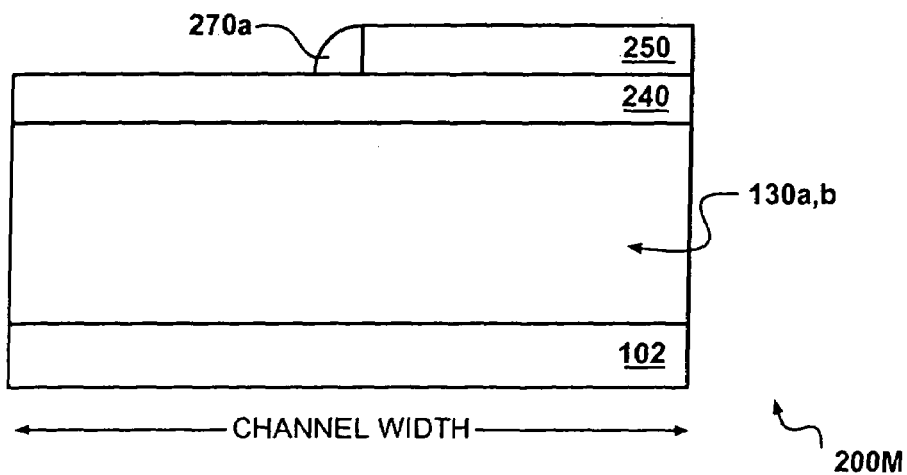
Figure 2N:
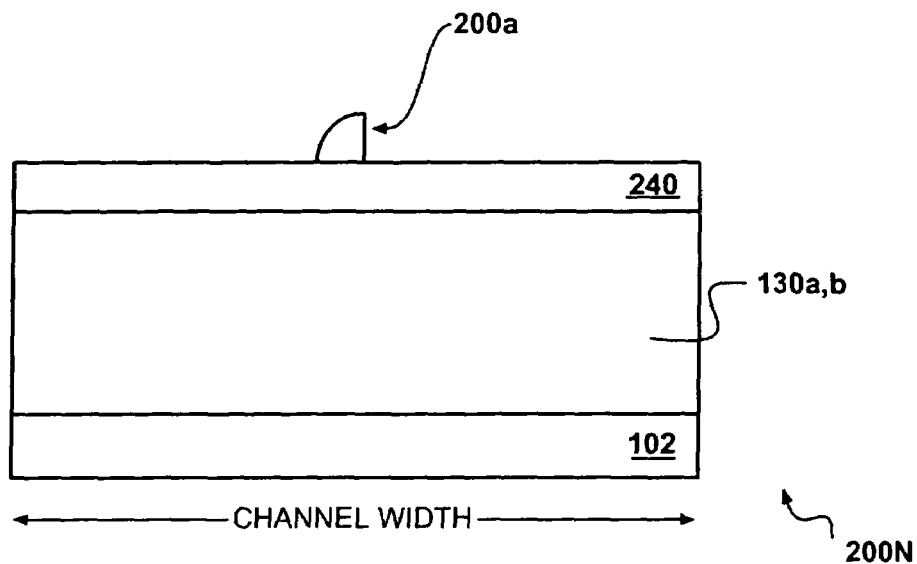
Figure 2O:
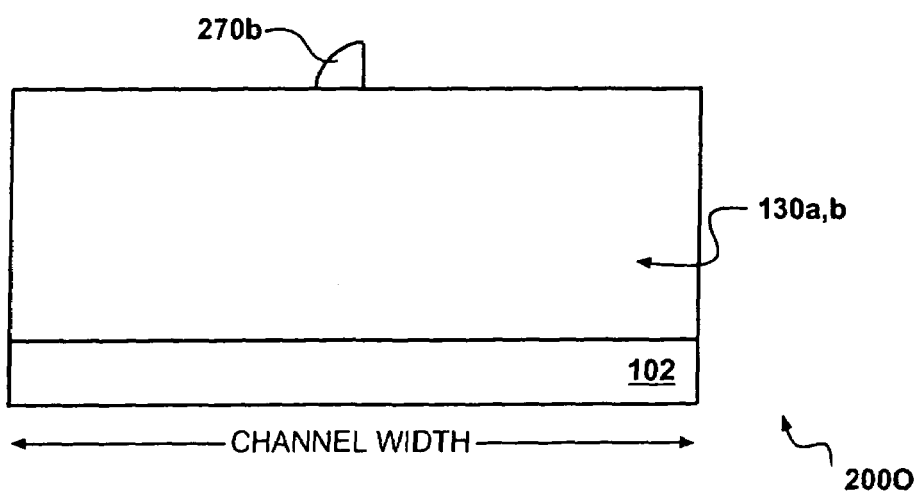
Figure 2P:
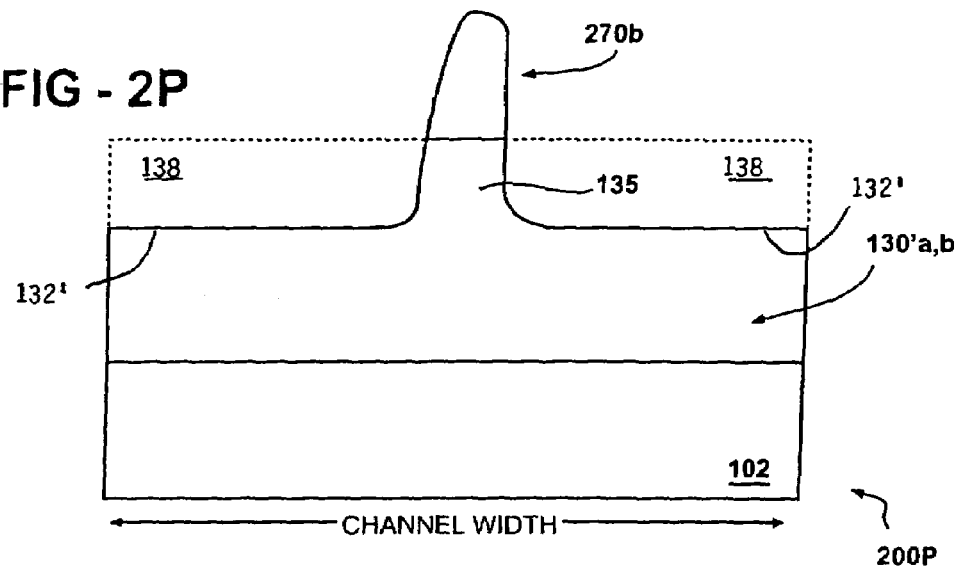
Figure 2P:
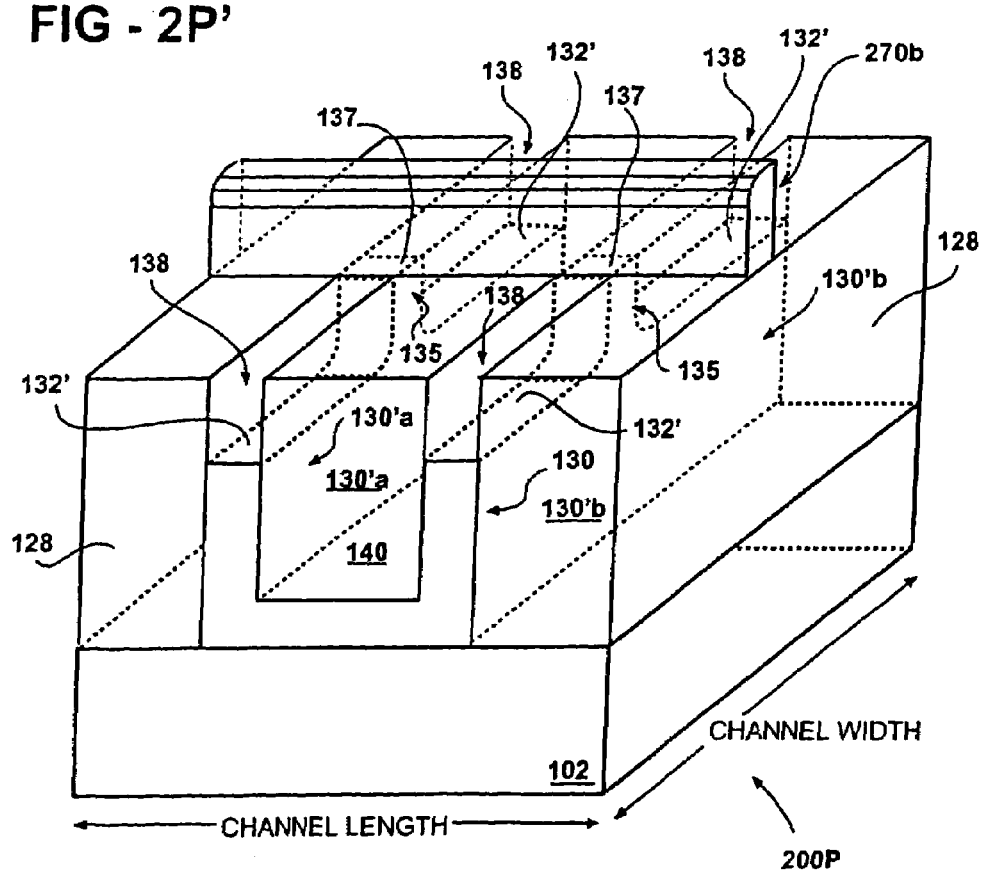

The structure 200 O is then etched to remove portions of the conductive layers 130A,B that do not underlie the oxide spacer 270B. The oxide spacer serves as a mask. The portion of edge 132 not underlying the oxide spacer 20B is recessed to form the recessed edge 132' and the raised portion 135 that extends from the recessed edge 132', as shown in FIGS. 2P and 2P'. The raised portion 135 underlies the oxide spacer 270B. FIG. 2P is a cross-section view through a recessed conductive layer 130'A,B parallel to the channel width while FIG. 2P' is a three-dimensional representation. Preferably, the etch is a dry etch such as a plasma etch. The etch is also preferably anisotropic so as to form a raised portion 135 having substantially straight sidewalls. However, it may also be possible to use an isotropic etch in order to form a raised portion with sloped sidewalls. Hence, the raised portion 135 may be tapered (where the degree of tapering is controlled by the etching process used). Preferably, those sections of the conductive spacers not protected by the oxide spacer 270 are recessed between about 1000 and 1500 Angstroms. Hence, the raised portions 135 preferably have a height of about 1000 to about 1500 angstroms.

Figure 2Q:
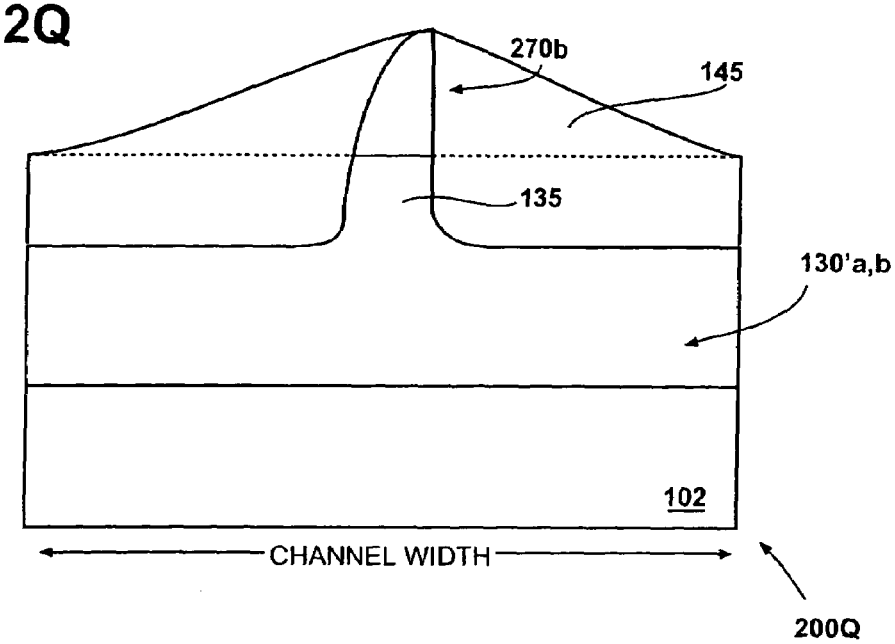
Figure 2R:
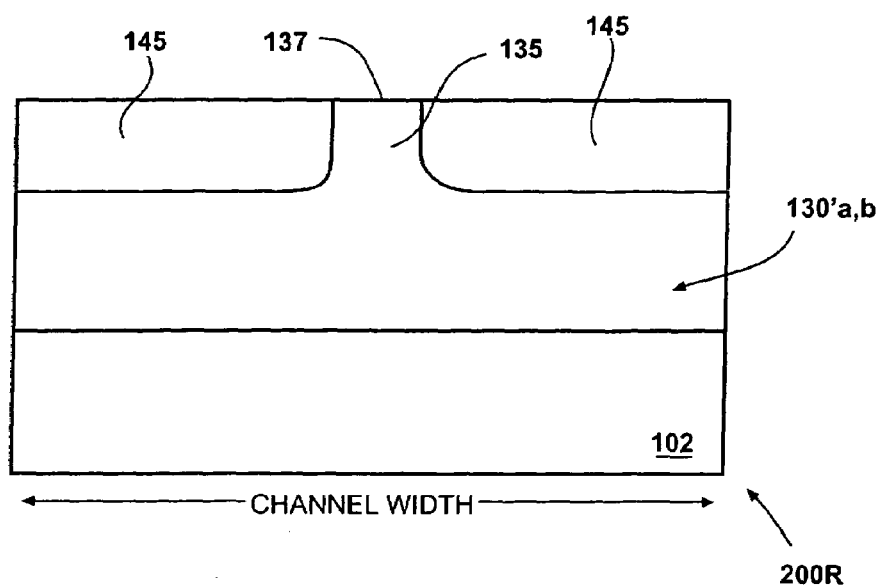

A layer 145 of insulation material (such as silicon dioxide) is then conformally deposited into the recesses 138 and on top of the structure 200P shown in FIGS. 2P and 2P' using conventional deposition methods (such as chemical vapor deposition) to form the structure shown in FIG. 2Q. The insulation layer 145 and the oxide spacer 270B may then be chemically mechanically polished (CMP) to expose the top surface or tip 137 of raised portion 135 and form the structure 200R shown in FIG. 2R. A layer of memory material 290 and a second electrical contact 300 (i.e., a top electrode) are deposited on top of the structure shown in FIG. 2R to form the memory element shown in FIG. 2S. It is noted that, after chemical mechanical polishing to form the structure 200R shown in FIG. 2R (and before the deposition of the memory material), a barrier layer may, optionally, be formed on top of the structure 200R. (Hence, the barrier material would be formed between the top surface of the raised portion and the memory material). Barrier layer materials may be chosen to increase the conductivity between the electrical contact and the memory material, and/or improve the adhesion between the electrical contact and the memory material, and/or to prevent the electromigration of the electrical contact material into the memory material. Examples of certain barrier layer materials include, but are not limited to, titanium silicide, cobalt silicide and tungsten silicide.

Referring to FIG. 2P', it is again noted that etching the conductive sidewall layers forms the narrow recesses 138 where the conductive layers are not underlying the oxide spacer 270B. After is etching the conductive layers to form the recesses, it may be desirable to then etch the surrounding oxide regions 128 and 140 to the same level as the recessed edges 132' prior to depositing the oxide layer 145 (FIG. 2Q). This would eliminate the need for the insulation material 145 to fill the narrow recesses 138. This would also make the subsequent chemical mechanical processing step (to get to the structure shown in FIG. 2R) easier.

As explained above, the raised portions 135 may be made with the use of oxide spacers. In another embodiment of the present invention, the raised portions may be also made with nitride spacers that are preferably formed from silicon nitride. Referring FIGS. 2G through 2 O, nitride spacers may be formed by replacing the first oxide layer 240 with a first silicon nitride layer, by replacing the polysilicon layer 250 with an oxide layer (such as silicon dioxide from a TEOS source) and by replacing the second oxide layer 260 with a second silicon nitride layer. The polysilicon etch (used to etch the polysilicon 250 as shown in FIGS. 2J and 2N) would be replaced with an oxide etch selective to an underlying silicon nitride material. Likewise, the oxide etch (used to anisotropically etch the oxide layers as shown in FIGS. 2M and 2 O) would be replaced with a silicon nitride etch.

As noted, the raised portions or protrusions as well the remaining conductive layer may be formed from any conductive material. Examples of materials include, but are not limited to, n-type doped polysilicon, p-type doped polysilicon, p-type doped silicon carbon alloys and/or compounds, n-type doped silicon carbon alloys and/or compounds, titanium-tungstem, tungsten, tungsten silicide, molybdenum, and titanium nitride. Other examples include titanium carbon-nitride, titanium aluminum-nitride, titanium silicon-nitride, and carbon.

Figure 2S:
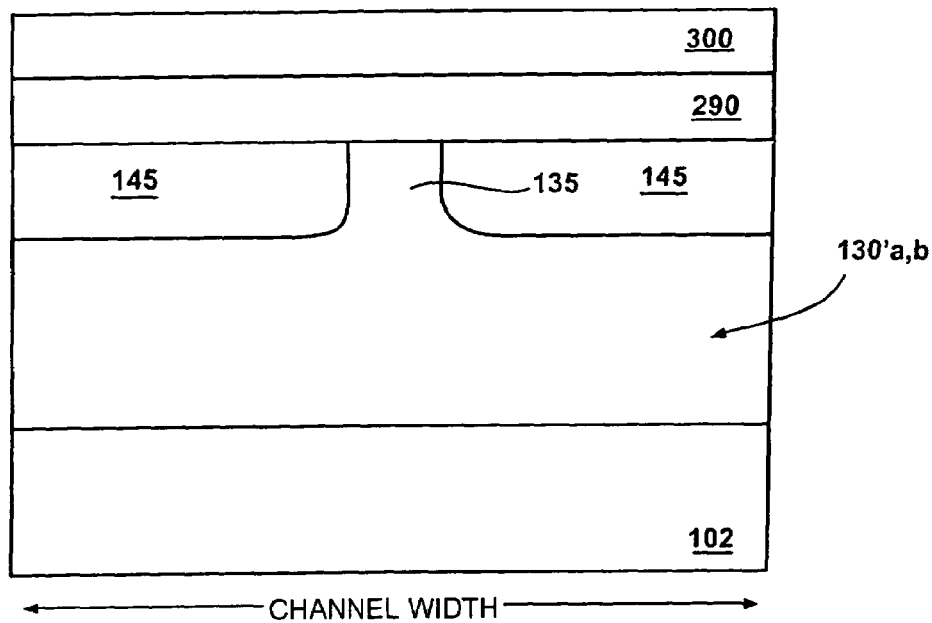

In the embodiment of the memory device shown in FIG. 2S, the raised portion 135 extends from an edge of conductive layer 130'A,B. In the example shown, the conductive layer is a substantially planer, sidewall layer formed along the sidewall surface of a trench by depositing a layer of conductive material into the trench and then anisotropically etching the layer to remove the horizontally disposed surfaces.

Raised portions or protrusions may be formed on an edge or peripheral portion on any conductive layer, and, in particular, on the edge or peripheral portion of any conductive sidewall layer. Alternate forms of conductive sidewall layers may be made by the conformal deposition of a conductive material onto sidewall surfaces having various shapes and configurations. For example, a layer of conductive material may be substantially conformally deposited onto the sidewall surfaces of a via, mesa or pillar. The via, mesa or pillar may be round, square, rectangular or irregularly shaped. Anisotropically etching the conformally deposited conductive layer, removes the horizontally disposed portions of the deposited layer and leaves only one or more vertically disposed portions. The remaining one or more vertically disposed portions are sidewall layers in the form of conductive sidewall spacers having different shapes.

The sidewall spacer formed, for example, by the conformal deposition of a conductive material into a cylindrical via (followed by an anisotropic etch) will be a conductive sidewall layer in the form of a cylindrical surface having two open ends. The top edge of the layer will be in form of an annulus. Changing the shape of the via (or pillar or mesa) will change the shape of the sidewall spacer. That is, the lateral cross section of the conductive sidewall spacer (i.e. the cross section parallel to the substrate) corresponds to the shape of the via, mesa or pillar. Alternately, it may be rectangular or irregularly shaped.

Figure 3A:
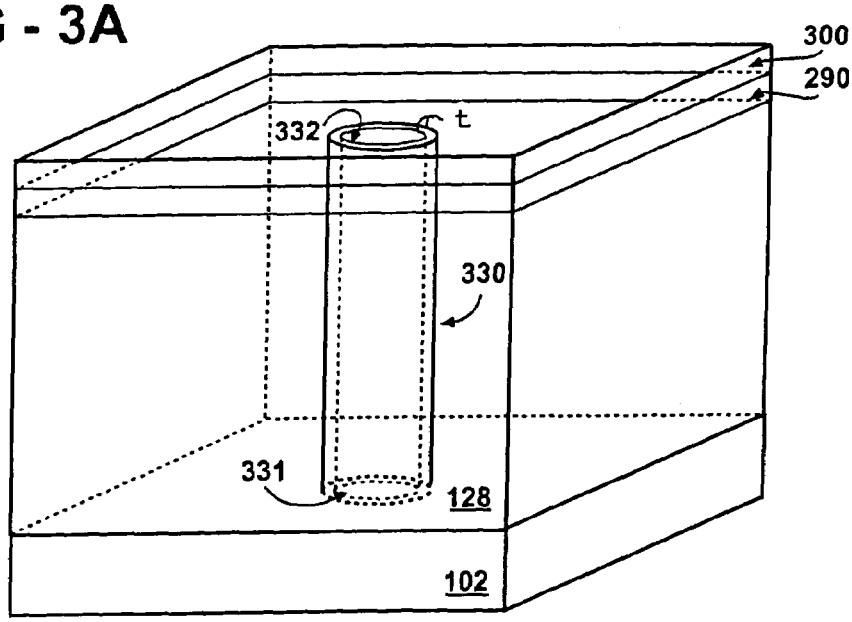
FIG. 3A is a three-dimensional view of a memory device having a cylindrically shaped conductive sidewall spacer as an electrical contact.

FIG. 3A shows a three-dimensional view of a cylindrical, conductive sidewall spacer 330 formed in a circular via (and thus having a horizontal cross-section in the shape of an annulus). The cylindrical conductive spacer 330 comprises a single, cylindrically shaped sidewall layer. The thickness "t" of this cylindrically shaped sidewall layer is the distance between the inner and outer cylindrical surfaces as shown in FIG. 3A. The cylindrical sidewall layer has two open ends or "rims" forming the top edge 332 and the bottom edge 331. The top and bottom edges 332 and 331 of the cylindrically shaped conductive sidewall layer 330 are annular surfaces formed by intersecting the conductive layer 330 with planes substantially parallel to the substrate. In the embodiment shown in FIG. 3A, the layer of memory material 290 is adjacent only to the top end (i.e., the top edge 332) of the cylindrical sidewall spacer 330. Substantially all electrical communication between the conductive spacer 330 and the memory material 290 is through the top edge 332 or a portion of the top edge 332. Hence, the area of contact between the conductive spacer 330 and the memory material 250 is the edge 332 or a portion of the edge 332. (That is, all or a portion of the annular surface 332).

Figure 3B:
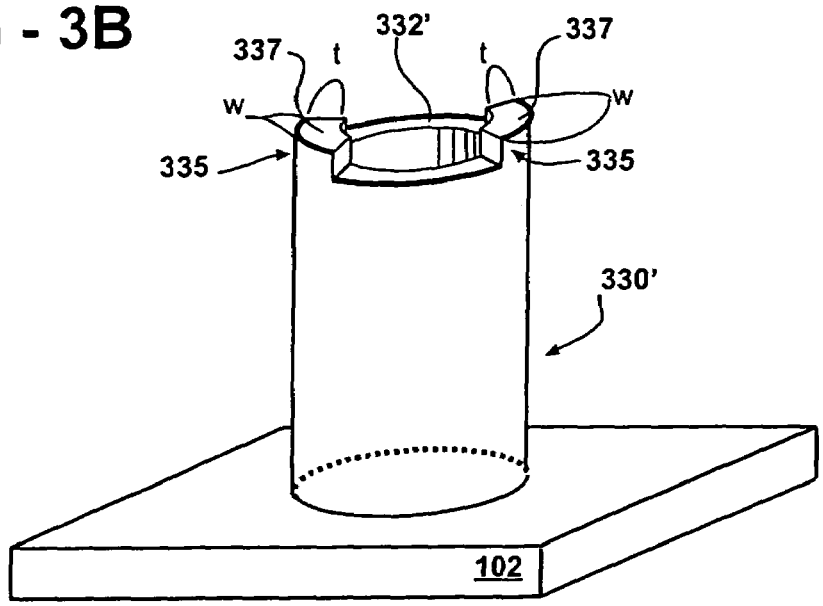
FIG. 3B is a three-dimensional view of cylindrically shaped conductive sidewall spacer with raised portions extending from the top edge of the sidewall spacer.

The raised portions or protrusions may be formed atop the annular edge of a cylindrical sidewall layer. FIG. 3B is a three-dimensional representation of a cylindrical conductive sidewall layer 330' that includes raised portion or protrusions 335 that extend from the edge 332'. Each raised portion 335 extends from edge 332' to an end or tip 337 adjacent the memory material (not shown). As noted above, the raised portions 335 are not limited to any particular shape. In the embodiment shown, the raised portions 335 have a thickness "t" (proportional to the thickness of the conductive layer) and a width "w". Conductive layer 330' is in the form of a cylindrical conductive spacer. The raised portions may be formed on the top edge of the cylindrical conductive layer 330' with the use of oxide spacers or nitride spacers as described above. An example of forming the raised portions atop the annular edge of a cylindrical sidewall layer will be given below. Preferably, substantially all electrical communication between the conductive spacer 330' and the memory material is through one or more of the raised portions 335. More preferably, substantially all electrical communication between the conductive spacer 330' and the memory material is through the upper surface or tip 337 of one or more of the raised portions 335. The electrical contact 330' and memory material may be positioned so that only the top end or tip 337 of one or more of the raised portions 335 are adjacent to the memory material while substantially all of the remaining portion of the electrical contact is remote to the memory material.

Figure 3C:
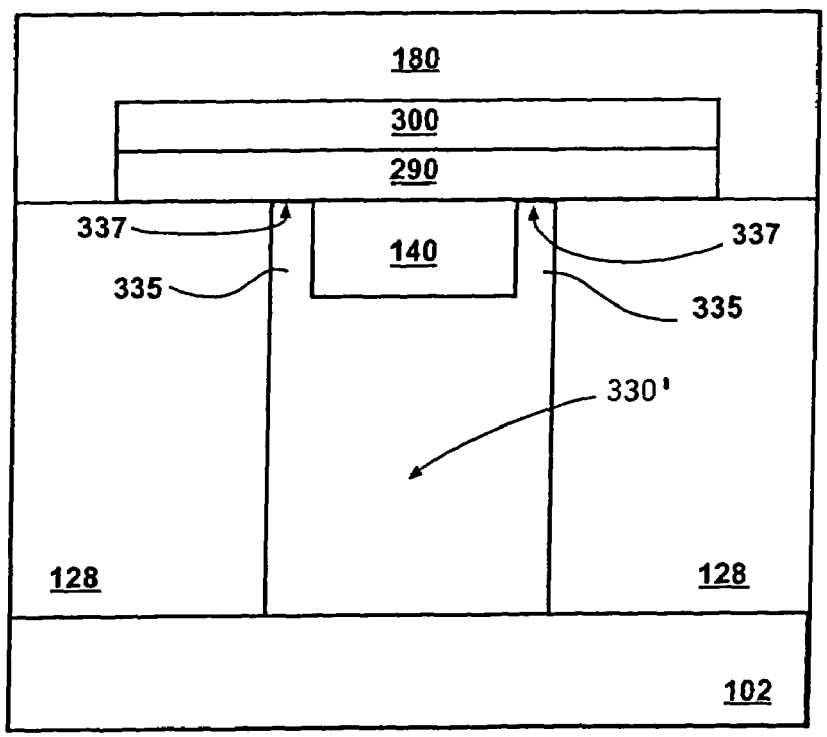
FIG. 3C is a side view of a memory element using the electrical contact from FIG. 3B.

FIG. 3C is a two dimensional side view of the cylindrical conductive layer 330' showing the memory material 290 as well as the top electrical contact 300 (and also insulation materials 128, 140 and 180). In FIG. 3C both of the raised portions 335 are in electrical communication with the memory material. However, it is also possible that the memory material and the raised portions 335 and the memory material be positioned relative to each other so that only one of the protrusions 335 is touching the memory material. In the embodiment shown in FIG. 3C only the top surfaces or tips 337 are adjacent the memory material while the remainder of the electrical contact is remote to the memory material.

Figure 4A:
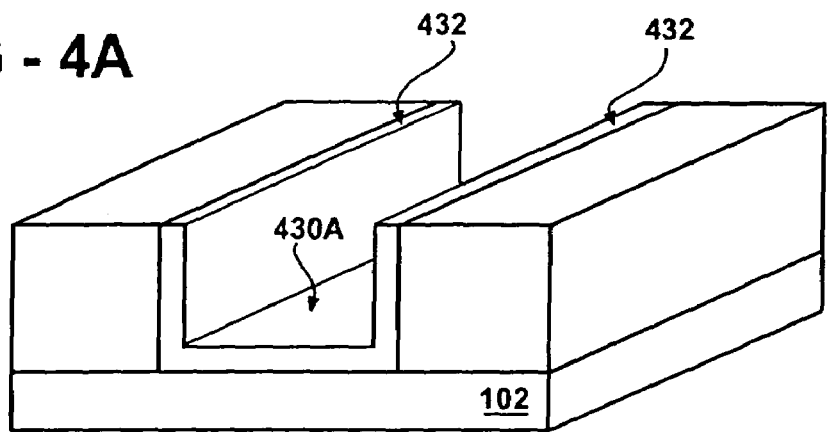
FIG. 4A is a conductive liner formed in a trench.
Figure 4B:
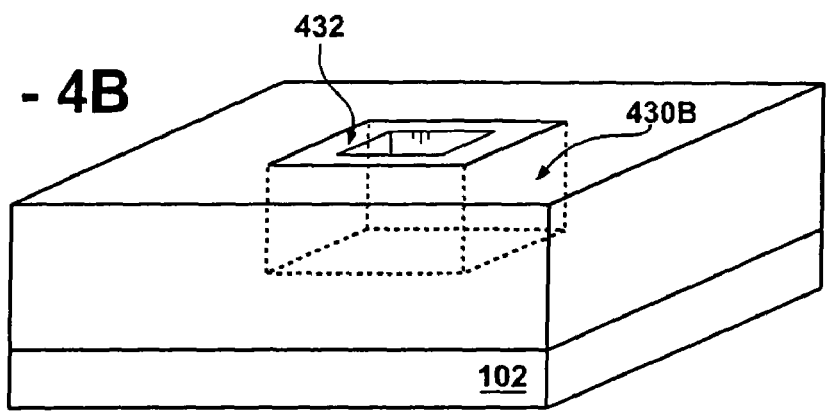
FIG. 4B is a conductive liner formed in a rectangular via.
Figure 4C:
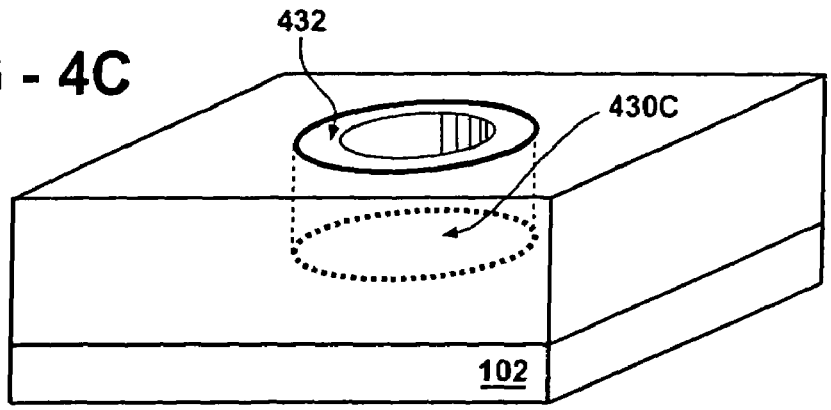
FIG. 4C is a conductive liner formed in a circular via.

In the embodiments shown above, the conductive sidewall layers have been formed as conductive sidewall spacers. However, it is possible to form conductive sidewall layers in other ways. For example, a conductive sidewall layer may be formed as a portion of a "conductive liner". The conductive liner is preferably a single layer of conductive material deposited on the sidewall surfaces as well as the bottom surface of a trench, via, or the like. Examples of conductive liners are shown in FIGS. 4A–C. In FIG. 4A, the conductive liner 430A is formed in a trench. FIG. 4B is an example of a conductive liner 430B formed in a rectangular via hole. FIG. 4C is an example of a conductive liner 430C formed in a circular via hole of course, other shapes are also possible. As shown in the FIGS. 4A–4C, each conductive liner has one or more sidewall layer portions as well as a bottom layer portion. The top end of the conductive liners is an open end having a top edge 432. (In the specific examples shown, the "top edge" 432 of each conductive liner is the surface formed by intersecting the respective conductive liner with a plane substantially parallel with the substrate 102). It is noted that the U-shaped conductive liner shown in FIG. 4A has a "dual" top edge 432.

It is noted that in the examples of the conductive liners shown in FIGS. 4A–4C, the sidewall layer portions are substantially vertically disposed. However, this does not have to be the case. The sidewall layer portions may be tilted. This would be the case if the conductive liners were formed in either a trench or via having angled sidewall surfaces.

Figure 5A:
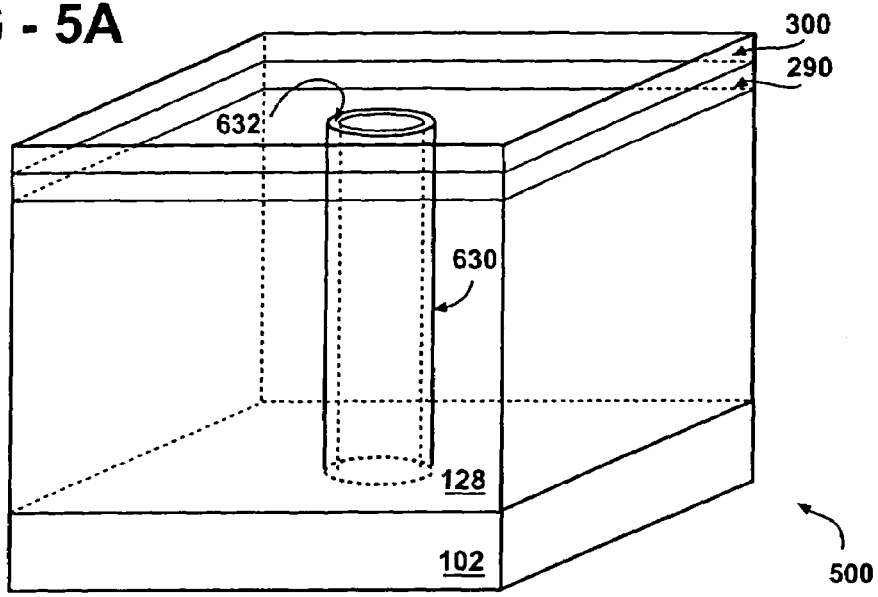
FIG. 5A is a three-dimensional view of a memory device using a conductive liner as an electrical contact.
Figure 5B:
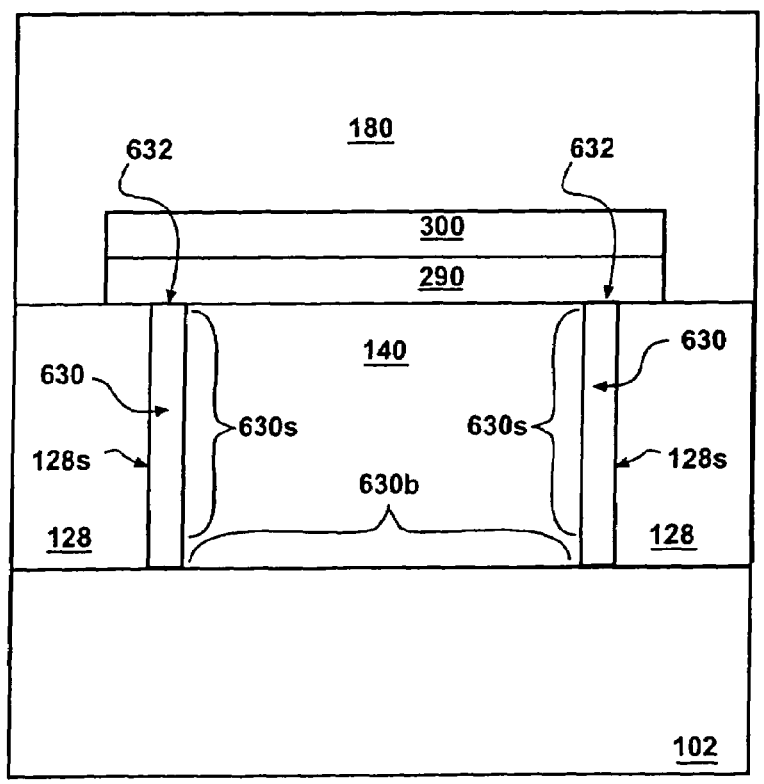
FIG. 5B is a cross-sectional view of the memory device of FIG. 5A.

FIGS. 5A and 5B depict an embodiment of the memory element where the bottom electrical contact is a conductive liner 630 formed in a circular via. FIG. 5A is a three-dimensional view of the memory element while FIG. 5B is a cross-sectional view.

As seen, the conductive liner 630 is a cylindrical shell having an open top end (remote to and facing away from the substrate 102) and a closed bottom end (preferably adjacent to and in electrical communication with the substrate). The open top end has an annular top edge 632. The conductive liner 630 comprises a cylindrically shaped sidewall layer portion 630S and a bottom layer portion 630B.

In the example shown in FIGS. 5A and 5B, the conductive liner 630 is in the shape of a cylindrically shaped cup. As shown in FIG. 5B, the sidewall layer portion 630S forms the side of the cup while the bottom layer portion 630B forms the bottom of the cup. The top edge 632 may be referred to as the "rim" of the cup. The conductive liner may have other cup shapes such as a paraboloid, hemisphere, cone, and frustum.

The layer 290 of memory material is preferably a planar, substantially horizontally disposed layer positioned adjacent to the open end (i.e., top edge 632) of the conductive liner 630. Hence, the memory material is adjacent only to the top edge 632 (i.e., the rim) of the conductive liner 630 or a portion of the top edge 532 of the conductive liner. The remainder of the conductive liner 630 is remote to the memory material. Preferably, substantially all electrical communication between the conductive liner 630 and the memory material occurs through the edge 532 or a portion of the edge 632. Hence, the area of contact is defined by all or a portion of the edge 632 (i.e., an edge portion).

The edge 632 is an annulus having a thickness equal to the thickness of the conductive liner 630. The thickness of this annulus, and hence the area of contact between the conductive liner and the memory material may be reduced by decreasing the thickness of the conductive liner 630 deposited into the circular via. It is noted that it is possible that one or more intermediate layers be disposed between the memory material and the conductive liner.

Figure 5C:
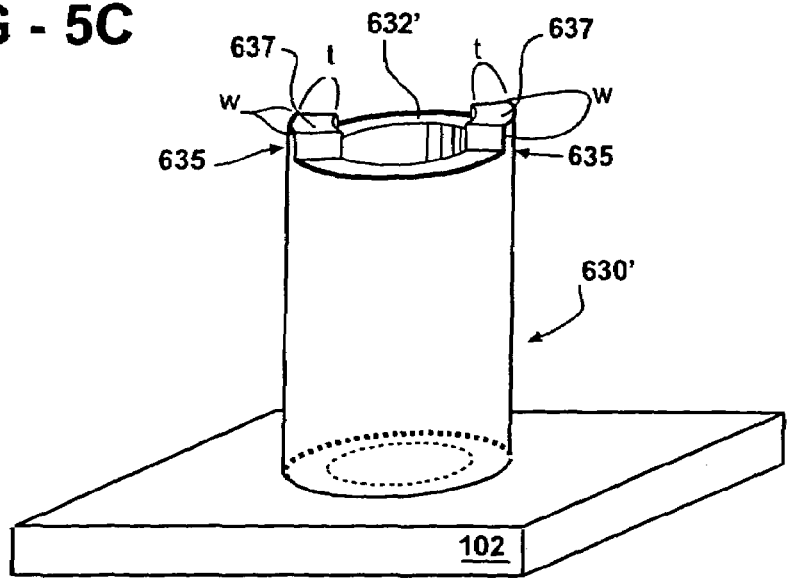
FIG. 5C is a three-dimensional view of a cylindrically shaped conductive liner with raised portions extending from the top edge of the conductive liner.

One or more raised portions or protrusions may be formed on the top edge of the sidewall portion of a conductive liner. FIG. 5C shows the cylindrical conductive liner 630' disposed on top of a substrate 102. In this embodiment, the conductive liner 630' includes at least one raised portion or protrusion 635. Each of the raised portions extends from the top edge 632' to ends or tips 637 adjacent the memory material (the memory material is not shown in this diagram). In the embodiment shown, the raised portions 635 each have a thickness which is substantially the same as the thickness of the remainder of the conductive liner 630'. Preferably, substantially all electrical communication between the conductive sidewall spacer 630' and the memory material is through one or more of the raised portions 635. More preferably, substantially all electrical communication between the conductive spacer 630' and the memory material occurs through the top surface or tip 635 of one or more of the raised portions 635. Hence, the electrical contact 630' and memory material may be positioned so that only the top surface 637 of one or more of the raised portions 635 is adjacent to the memory material while substantially all of the remaining portion of the electrical contact is remote to the memory material.

Figure 5D:
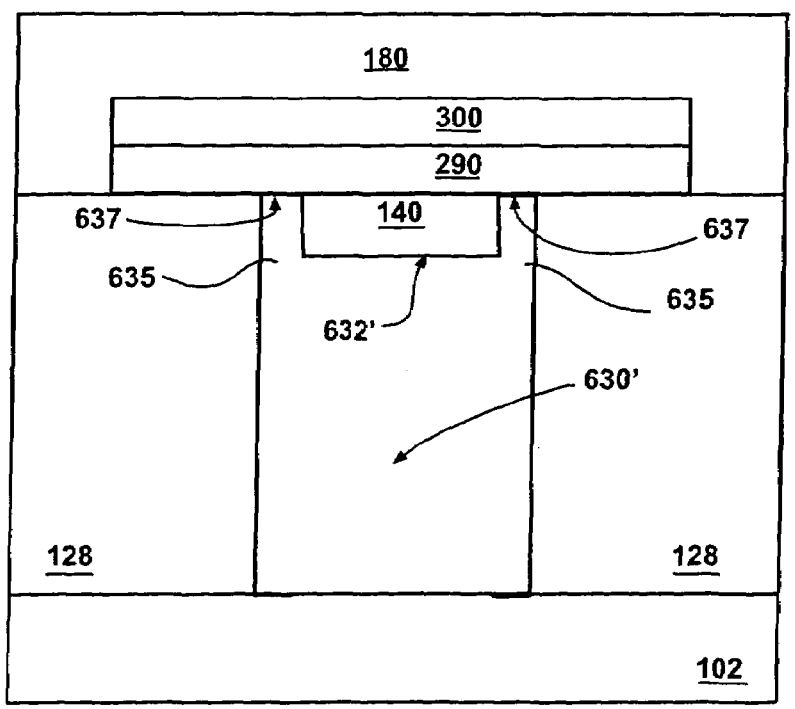
FIG. 5D is a side view of a memory element incorporating the electrical contact from FIG. 5C.

FIG. 5D shows a cross-sectional view of a memory element made using the conductive liner 630'. Shown are memory material 290 and second electrical contact 300. In FIG. 5D, the tips 637 of both protrusions 635 are in electrical contact with the memory material; however, it is possible that the memory material be positioned so that it is in electrical contact with only the upper surface 637 of only one of the protrusions 635. The base of the conductive liner 630' is adjacent to and in electrical communication with the substrate 102.

Figure 6A:
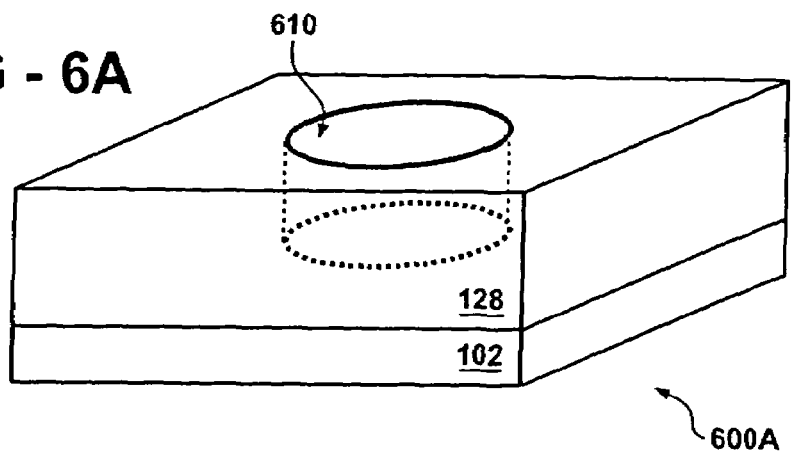
FIGS. 6A–6R' is an embodiment of a process for making a memory element shown in FIG. 5D.
Figure 6B:
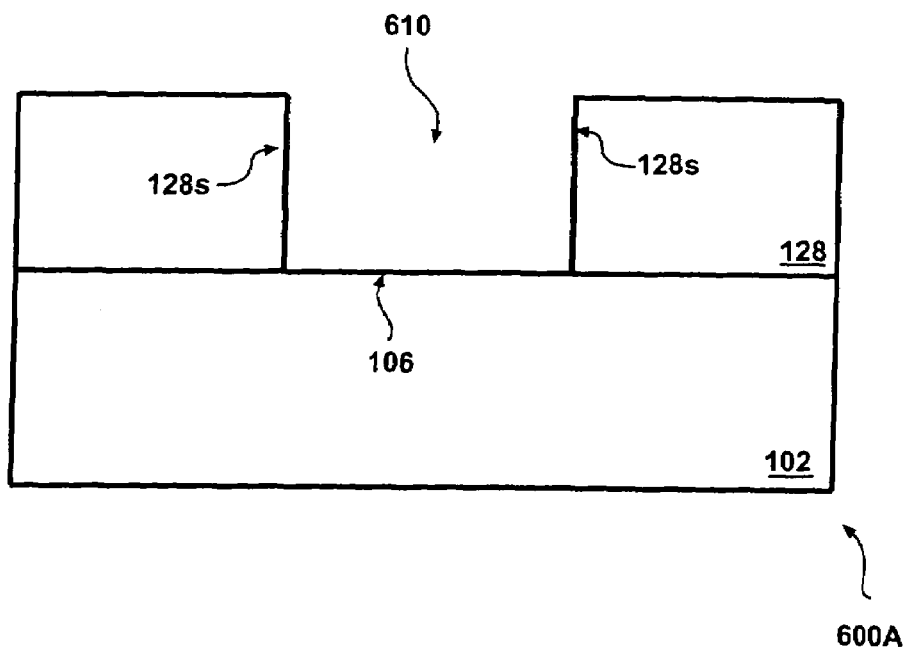

The raised portions 635 may be formed with the use of oxide or silicon nitride spacers are described above. An embodiment of a method for fabricating the conductive liner 630' is shown FIGS. 6A–6P. Referring first to FIG. 6A, a substrate 102 is provided and a dielectric layer 128 is deposited on top of the substrate 102. The dielectric layer may be formed from silicon dioxide and may be deposited by a chemical vapor deposition process. The dielectric layer 128 is then appropriately masked and etched to form a window or opening in the form of a via 610 in the dielectric 128 as shown. The via may be round, square, rectangular or irregularly shaped. (Alternately, the dielectric layer 128 may be masked and etched to form a trench). In the embodiment shown in FIG. 6A, the resulting structure 600A is a circular via 610 which is formed in the dielectric 128. FIG. 6B is a vertical cross-sectional view of the structure 600A shown in FIG. 6A. The sidewall surface 128S and the bottom surface 106 of the circular via 610 is shown in FIG. 6B.

Figure 6C:
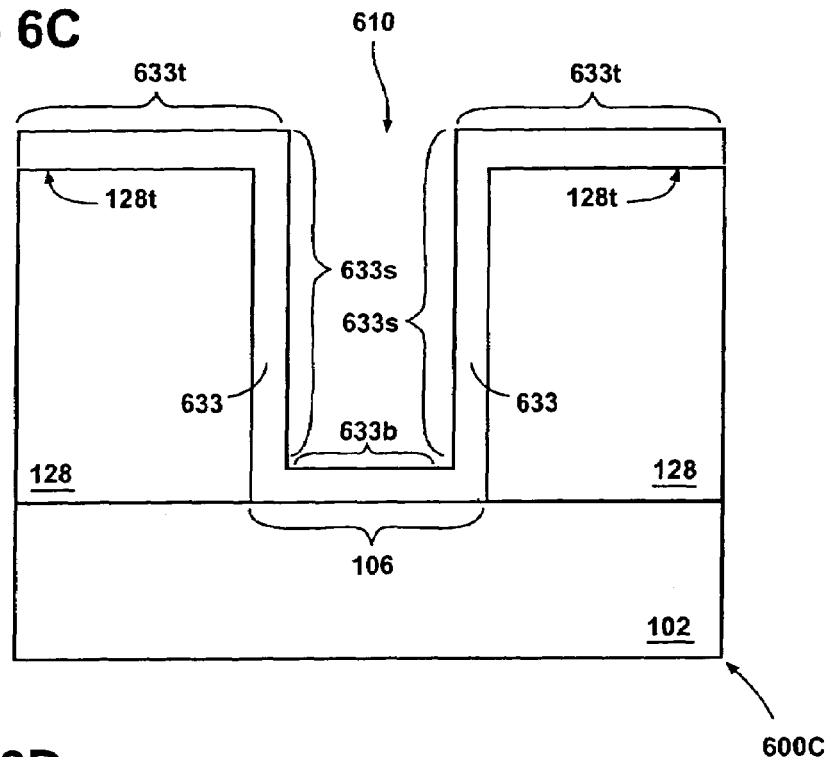

A layer 633 of a conductive material is deposited on top of the structure shown in FIGS. 6A and 6B to form the structure 600C shown in FIG. 6C. The layer 633 of conductive material is conformally deposited on top surfaces 128T of the dielectric region 128, on the sidewall surface 128S of the region 128 and the bottom surface 106 of the via hole 640. Hence, the layer 633 has a top portion 633T, a sidewall layer portion 633S, and a bottom layer portion 633B.

Figure 6D:
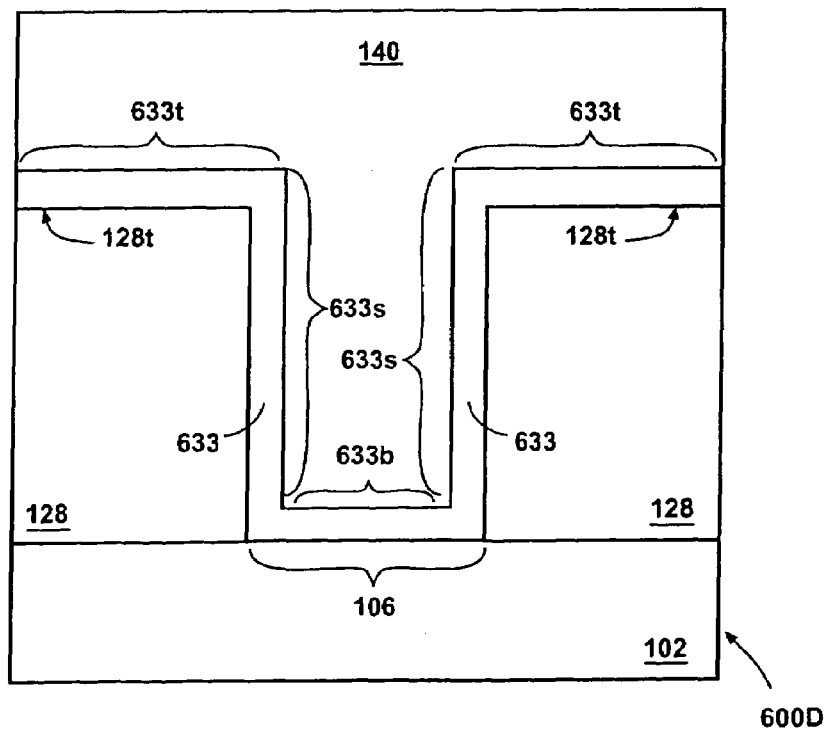
Figure 6E:
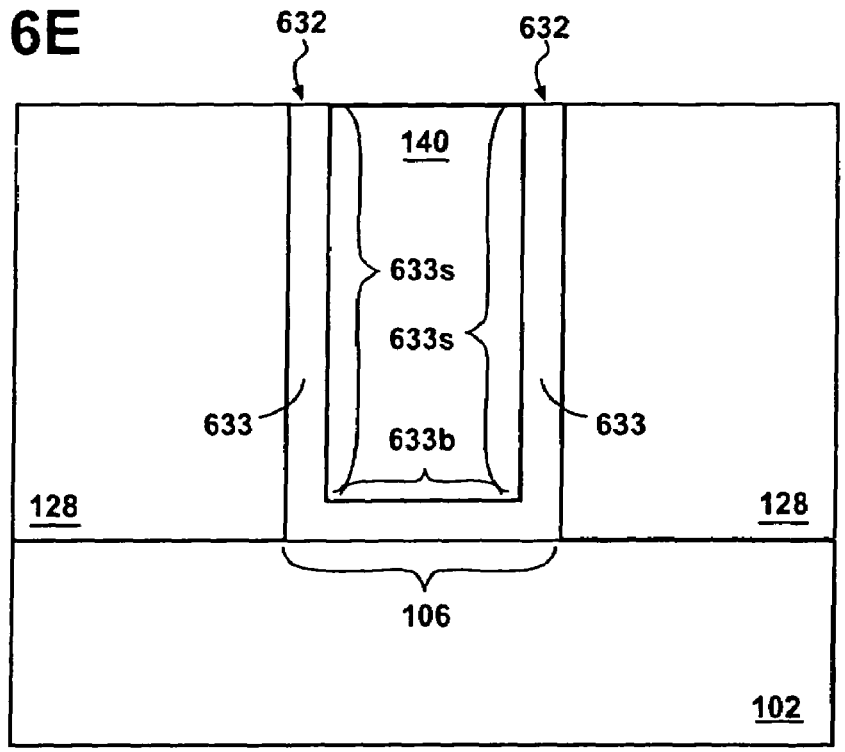
Figure 6E:
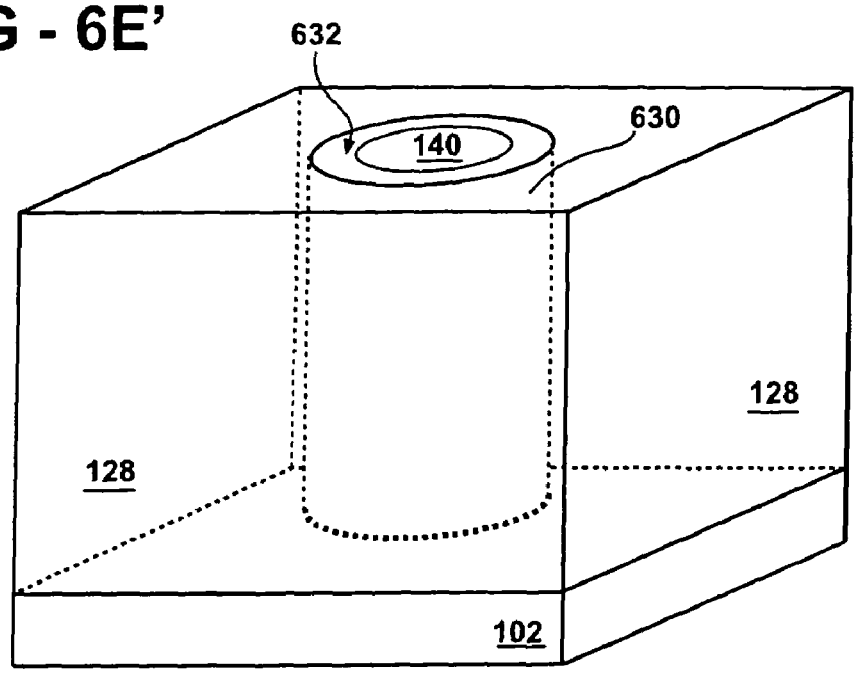
Figure 6F:
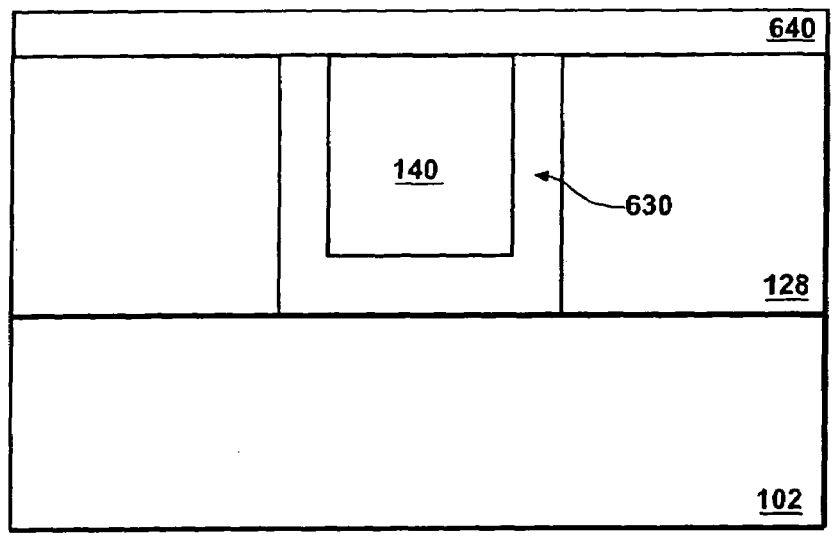
Figure 6F:
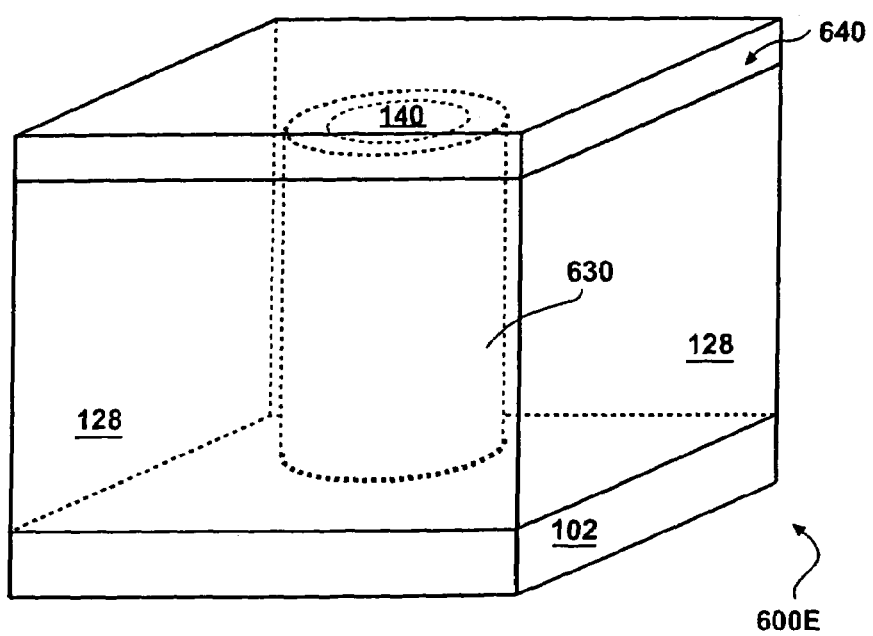

A layer of dielectric material 140 (such as silicon dioxide) may then be deposited on top of the layer 633 so as to fill the via 610 and form the structure 600D shown in FIG. 6D. The structure 600D may then be chemically mechanically polished (CMP) or dry etched so as to planarize the top surface thereby removing the top surface 633T portion of the layer 633 and forming a cylindrical, cup-shaped conductive liner. This is shown as structure 600E in FIG. 6E where the conductive liner 630 has a sidewall layer portion 630S along the sidewall 128S and a bottom layer portion 630B along the bottom surface 106. Furthermore, the conductive liner 630 has a top edge 632 which is in the shape of an annulus. Preferably, the planarization step forms a substantially planar top edge 632. FIG. E' shows a three-dimensional representation of the structure 600E from FIG. 6E.

Figure 6G:
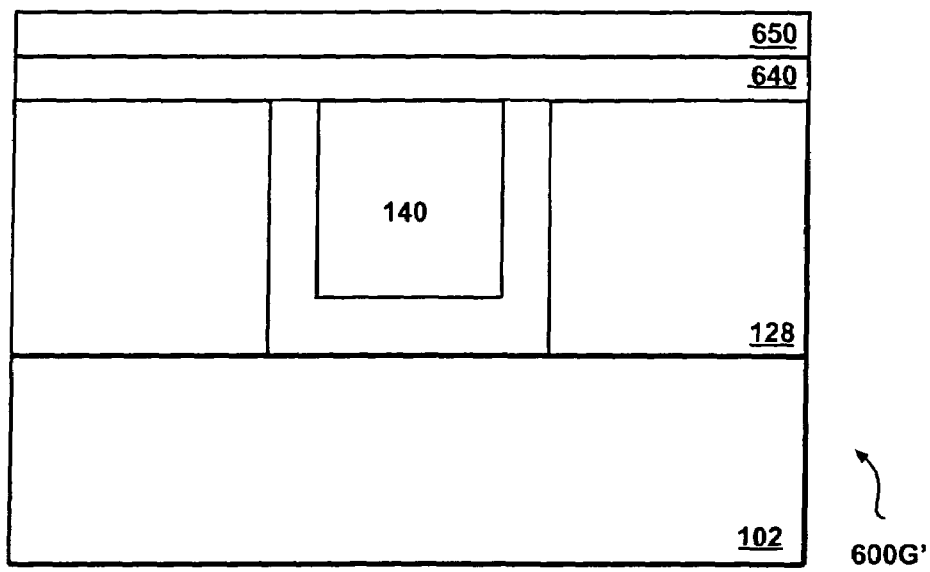
Figure 6G:
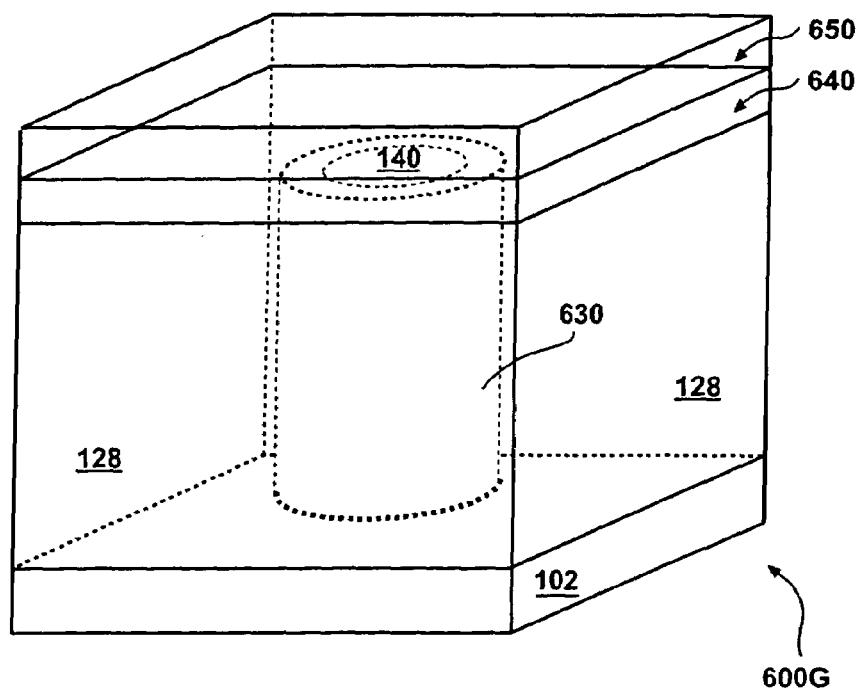
Figure 6H:
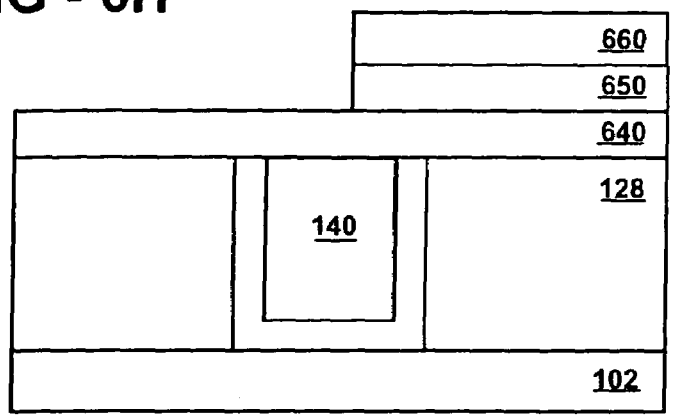
Figure 6H:
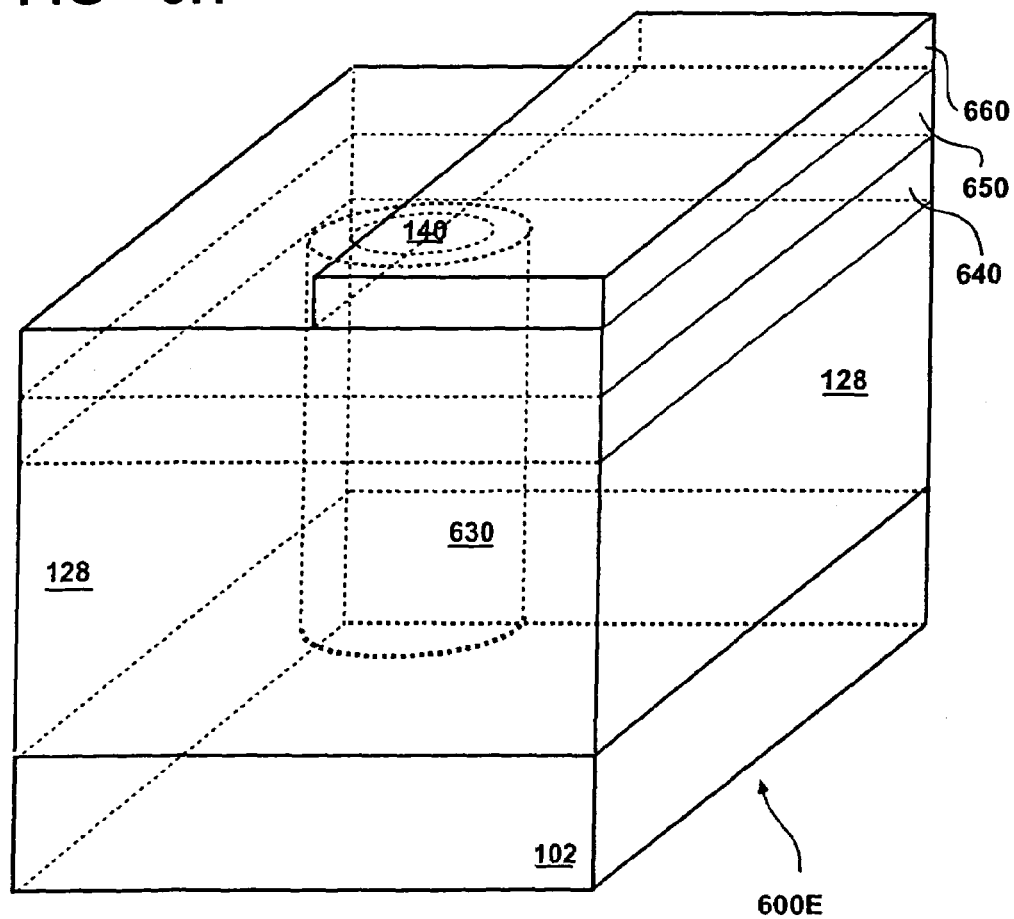
Figure 6K:
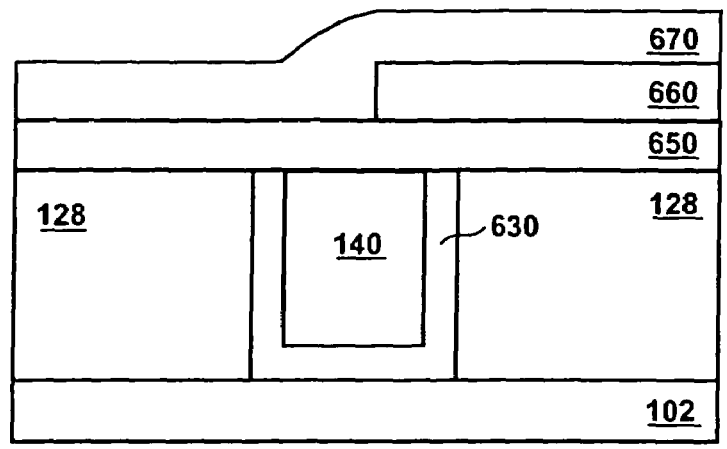
Figure 6L:
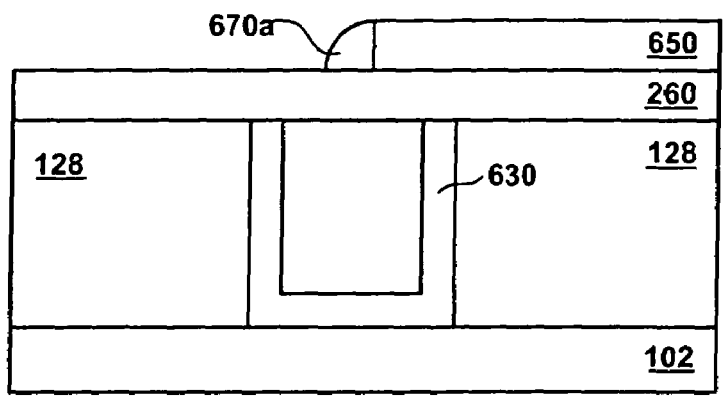
Figure 6M:
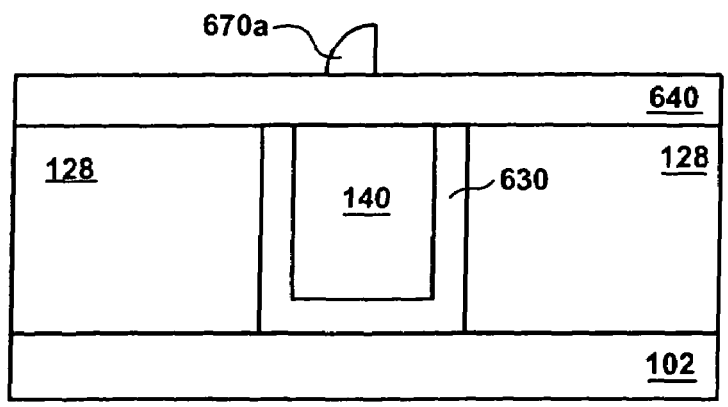
Figure 6N:
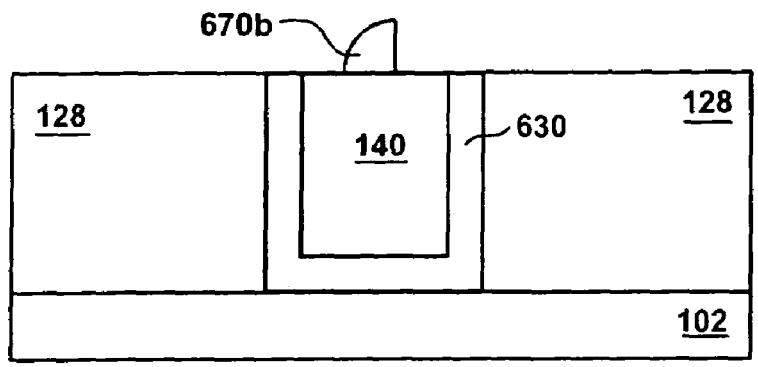
Figure 6N:
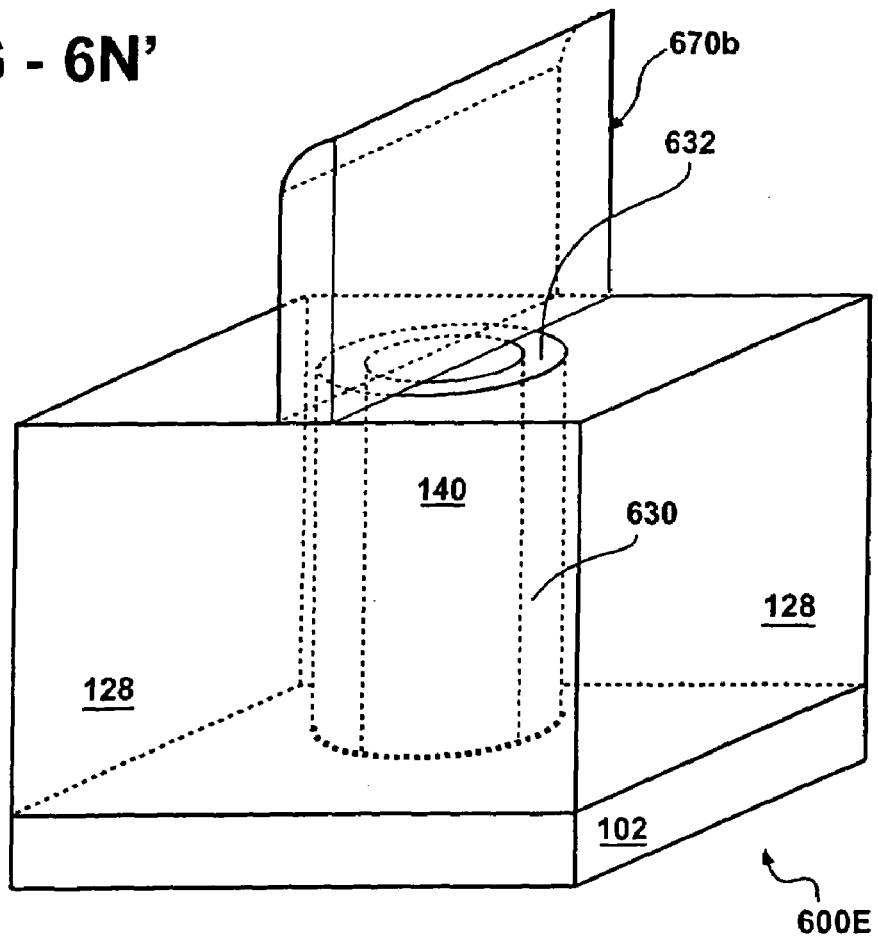
Figure 6O:
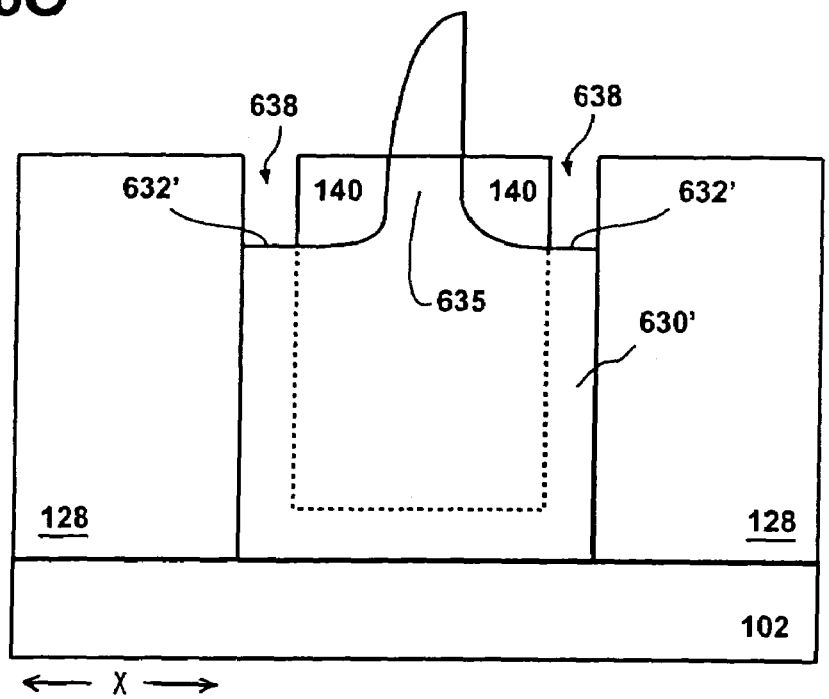
Figure 6O:
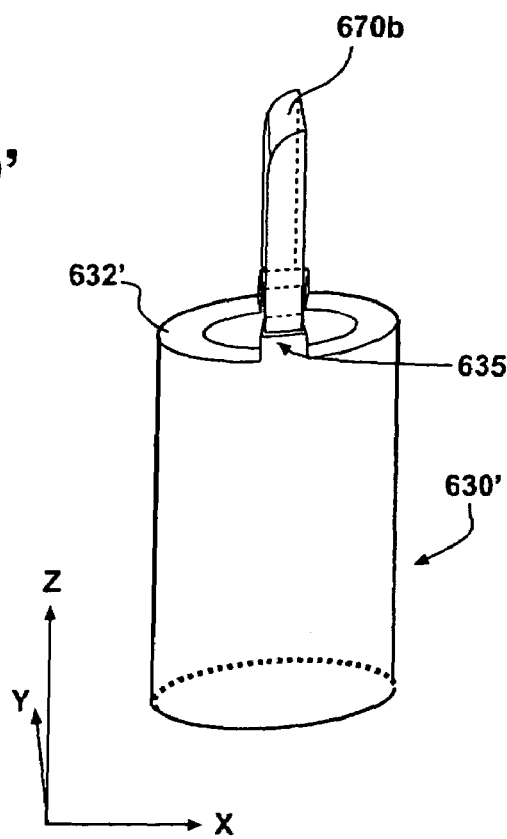

One or more raised portions or protrusions may be formed atop the annular edge 632. The processing steps for forming raised portions that extend from the top edge of the conductive liner are the similar to those described above with respect to the conductive sidewall spacers (i.e., FIGS. 2A to 2S). A first oxide layer 640 is deposited on top of the conductive liner 600E to form the structure 600F shown in FIGS. 6F and 6F". A polysilicon layer 650 is deposited onto the first oxide layer 640 so form structure 600G as shown in FIGS. 6G and 6G'. A resist layer 660 is deposited onto the polysilicon layer 650 and appropriately patterned to form the structure 600H shown in FIGS. 6H and 6H'. A top view of the positioning of the resist layer 660 relative to the annular edge of the conductive cup 630 is shown in FIG. 6H". The polysilicon layer 650 is appropriately patterned and etched to form a sidewall surface 652 to the layer 650 as shown in structure 600I of FIG. 6I. The resist material is then removed as shown in FIG. 6J. A second oxide layer 670 is conformally deposited over the remaining portion of the polysilicon layer 650 as well as over the first oxide layer 640 as shown in FIG. 6K. The horizontally disposed portions of the second oxide layer 670 are then removed via an anisotropic etch of the oxide layer 670 leaving the vertically disposed oxide portion 670A along the sidewall surface of the polysilicon layer 650 as shown in FIG. 6L. The remaining portion of the polysilicon layer 650 is then removed as shown in FIG. 6M. The remaining oxide layer 640 and oxide portion 6A are then anisotropically etched to removed the horizontally disposed surfaces, leaving the oxide spacer 670B shown in FIGS. 6N and 6N'. As shown in FIG. 6N', the oxide spacer 670B is positioned over the top edge 632 and crosses the annular top edge at two locations. The conductive material of the top edge 632 is then etched or recessed. The top edge 632 of the conductive cup 630 not directly the oxide spacer is etched to form a recessed edge. The portions of the conductive liner 630 that are directly under the oxide spacer 670B are not recessed and form raised portions that extend upwardly from the recessed edge. A side view of an etched conductive cup 630' having recessed edge 632' and raised portions 635 is shown in FIG. 6 O. Recession 638 is the gap formed between the oxide materials 128, 140 as a result of etching the conductive liner 630. A three-dimensional representation of the conductive liner 630' with the recessed edge 632' and the raised portions 635 is shown in FIG. 6 O'.

An oxide layer 680 is then deposited into the recession 638 and on top of dielectric layers 128 and 140 as shown (as a cross-sectional view) in FIG. 6 P. The oxide layer 680 and the oxide spacer 670B may then be chemically mechanically polished to expose the top surfaces or tips 637 of the raised portions 635 to form structure 600Q as shown in FIG. 6Q. A layer of memory material 690 and a top conductive layer 695 may then be deposited on top of structure 600Q to form the memory element 600R shown in FIG. 6R. FIG. 6R' shows an alternate side view of the conductive liner 630' showing both of the raised portions 635 with tips 637 adjacent the memory material 690. Only the top surfaces 637 of the raised portions 635 are adjacent to the memory material 690 while the remainder of the raised portions as well as the remainder of the conductive liner 630' is remote to the memory material 690. It is noted that the memory layer 690 may be positioned to that it is adjacent to only one of the raised portions 635.

Figure 6P:
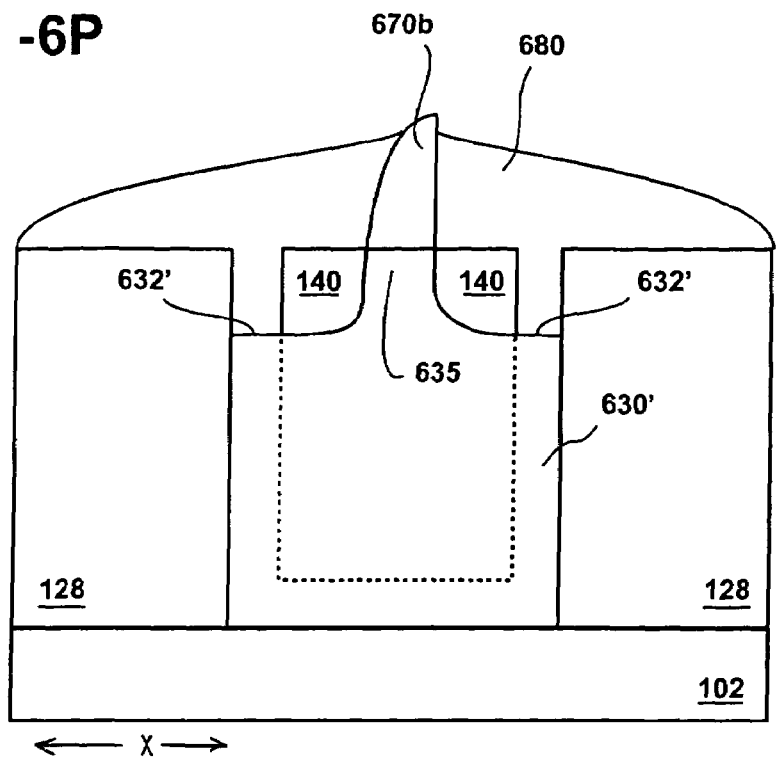
Figure 6Q:
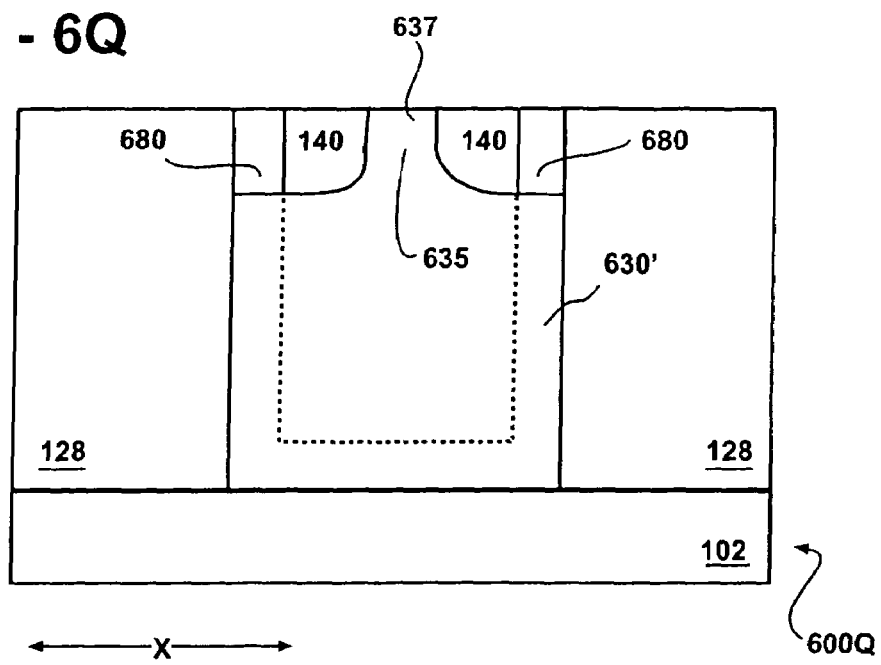
Figure 6R:
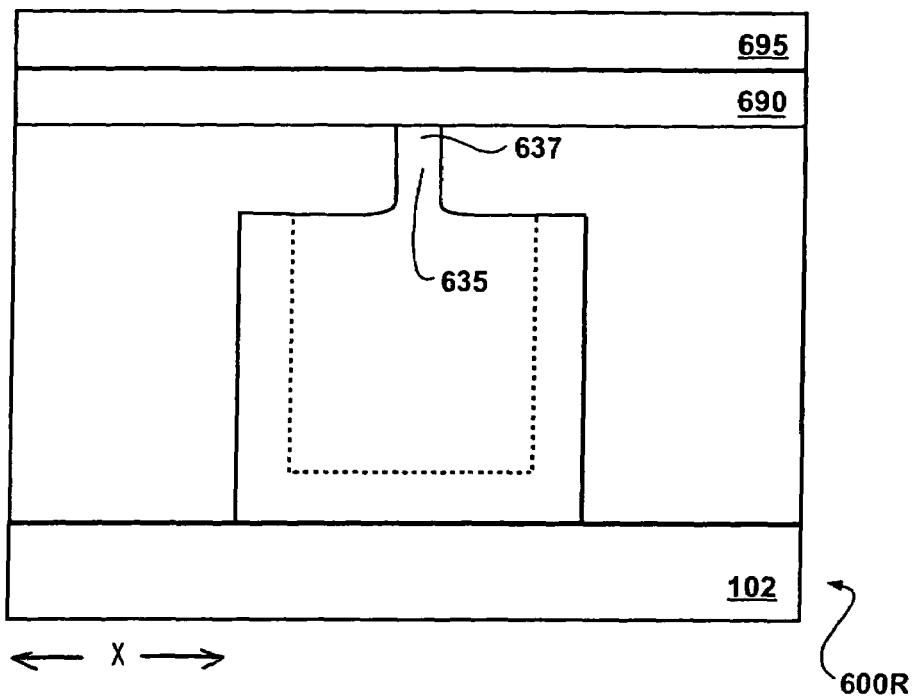
Figure 6R:
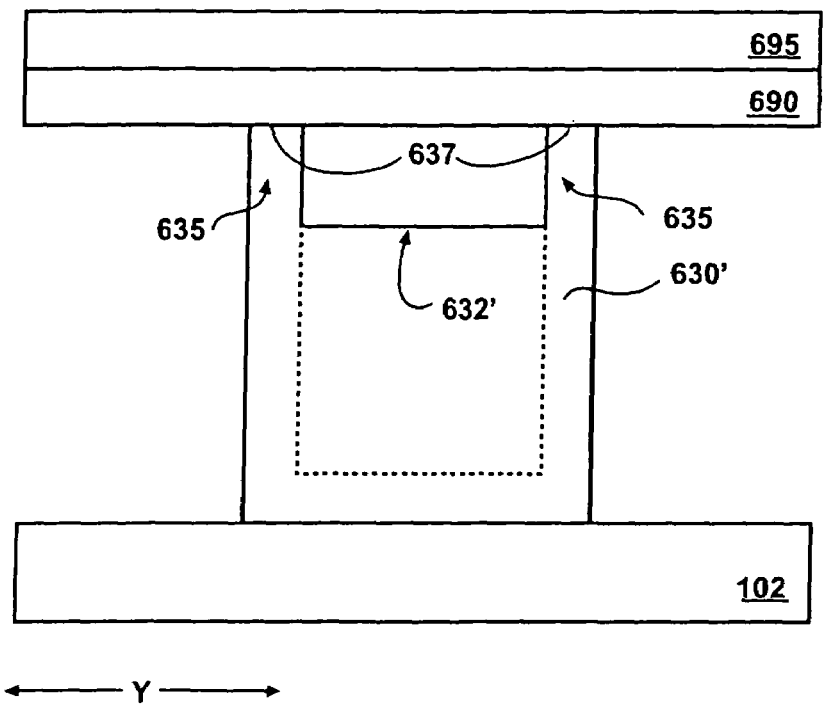

It is noted, prior to the deposition of the oxide layer 680 shown in FIG. 6P it is possible to etch the dielectric regions 128 and 140 (shown in FIG. 6 O) to the level of the recessed edge 632'. This avoids the need to have the oxide material 680 fill the narrow gas 638 and also facilitates the chemical mechanical polishing.

Also, as discussed above, it is possible to form protrusions 635 by using silicon nitride spacers rather than of oxide spacers. Referring to FIG. 6K, silicon nitride spacers may be formed by replacing the first and second oxide layers 640 and 670 with first and second layers of silicon nitride and by replacing the polysilicon layer 650 with an oxide layer.

Figure 7:
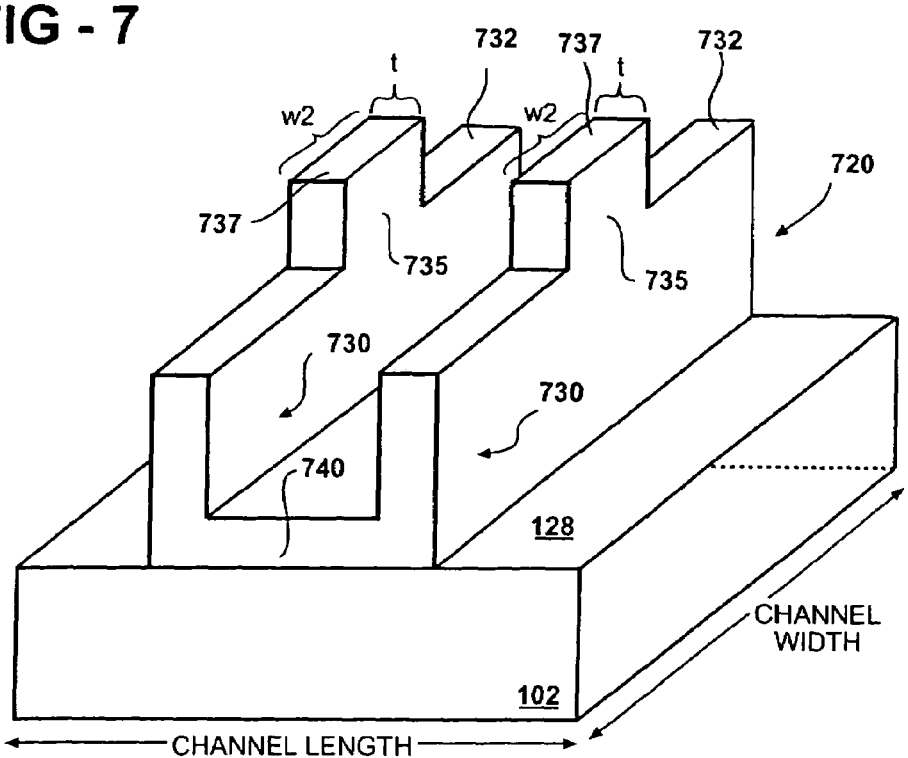
FIG. 7 is an example of a conductive liner with raised portions extending from a top edge of the liner's sidewall layers.

The raised portions or protrusions may be formed on the edge of the sidewall layers of different conductive liners. For example, they may be formed on the conductive liners shown in FIGS. 4A–4C. FIG. 7 provides an example of a U-shaped conductive liner 720 that is formed in a trench. FIG. 7 shows conductive liner 720 having two sidewall layer portions 730 and a bottom layer portion 740. The raised portions or protrusions 735 are formed on the edges 732 of the two sidewall layer portions 730 of the conductive liner 720. The protrusions 735 extend from the edges 732 to tips 737. Substantially all of the electrical communication between the conductive liner 720 and the memory material (not shown) is preferably through one or both of the raised portions 735, and more preferably, through one or both of the top surfaces 737.

Hence, as disclosed above raised portions or protrusions may be formed on the edge of conductive sidewall layer to form novel electrical contact structures. More generally, raised portions may be formed on an edge of any conductive layer, regardless of its shape or orientation. Hence, disclosed herein is an electrically operated memory element where at least one electrical contact includes one or more raised portions extending from an edge of the electrical contact. Substantially, all electrical communication between the memory material and the contact is through one or more of the raised portions. More preferably, substantially all electrical communication between the memory material and the electrical contact is through the tips or peaks of the one or more these raised portions.

The electrical contact is preferably a layer of conductive material whereby the raised portions extend from an edge of the layer. The conductive layer may have any shape or conformation. It may be a substantially planar surface. Alternately, it may be a curved surface. For example, the layer may be in the shape of a saddle, a cup, a cylinder, a tube, a hemisphere, a cone, a box, etc. Also, the contact layer may have any orientation. For example, it may be substantially vertically disposed, substantially horizontally disposed or tilted at some angle.

As seen above, the conductive layer may be a sidewall layer deposited along a sidewall surface. Any sidewall surface may be used. Examples include the sidewall surface of a trench, via, mesa or pillar. The sidewall surface may also be angled from the substrate and/or angled from the memory material. The conductive layer may be a substantially vertically disposed layer which is formed in other ways besides with the use of conformal deposition. The conductive layer may be in the form of a conductive spacer or a conductive liner. The conductive layer may be cupped shaped.

The conductive layer need not actually contact the memory material. Also, it is possible that there me one or more intermediate layers between the memory material and the conductive layer.

While not wishing to be bound by theory, it is believed that positioning the conductive layer so that it is substantially perpendicular to the memory material may increase the effective amount of heat energy transferred to and remaining within the memory material. The area of contact (defined by the edge of the contact layer) is smaller when the conductive layer is perpendicular to the memory material.

Conductive layers which are substantially vertically disposed have been described above with reference to the conductive spacer and liners. As mentioned above, other embodiments of the substantially vertically disposed layers are possible which are not formed as conductive spacers or liners. That is, vertical layers may be formed without the conformal deposition of a layer onto a sidewall surface. For example, vertical layers may be formed with the use of oxide spacers as explained above.

In the memory devices discussed above, the electrical contacts deliver electrical current to the memory material. As the electrical current passes through the electrical contacts and through the memory material, at least a portion of the electric potential energy of the electrons is transferred to the surrounding material as heat. That is, the electrical energy is converted to heat energy via Joule heating. The amount of electrical energy converted to heat energy (that is, the amount of Joule heating) increases with the resistivity of the electrical contact (and memory material) as well as with the current density passing through the electrical contact and the memory material.

Figure 8:
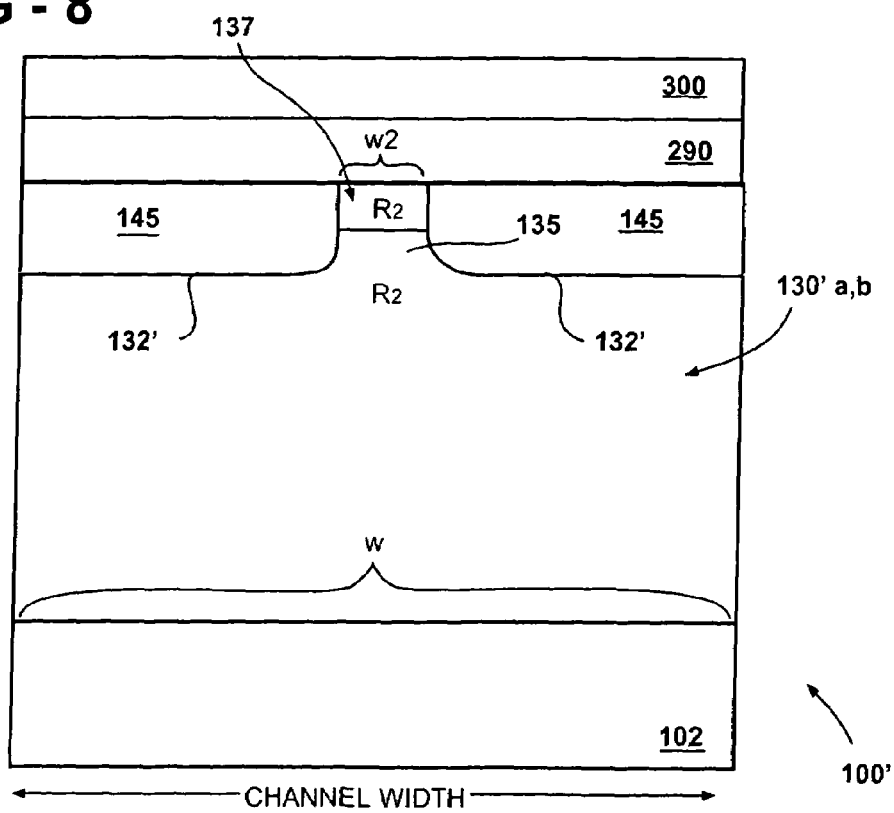
FIG. 8 is an example of an electrical contact having an increased resistivity in a region adjacent to the memory material.

To increase the amount of heat energy transferred into the memory material, it may be possible to increase the resistivity of the top surface or tip of the raised portion or protrusion that extends from the edge of the electrical contact. An example of this type of structure is shown in FIG. 8. FIG. 8 shows the conductive layer 130'A,B from FIG. 1C where the protrusion 135 has a region R2 (adjacent the memory material) which has a higher resistivity than the region R1 remote to the memory material.

The memory elements of the present invention may be electrically coupled to isolation/selection devices and to addressing lines in order to form a memory array. The isolation/addressing devices permit each discrete memory cell to be read and written to without interfering with information stored in adjacent or remote memory cells of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies.

Hence, associated with each memory element of a memory array structure is isolation/addressing device which serves as an isolation/addressing device for that memory element thereby enabling that cell to be read and written without interfering with information stored in other adjacent or remote memory elements of the array.

The memory element of the present invention comprises a volume of memory material. Generally, the volume of memory material is a programmable resistance memory material which is programmable to at least a first resistance state and a second resistance state. The memory material is preferably programmed in response to electrical signals. Preferably, the electrical signals used to program the materials are electrical currents which are directed to the memory material.

In one embodiment, the memory material is programmable to two resistance states so that each of the memory elements is capable of storing a single bit of information. In another embodiment, the memory material is programmable to at least three resistance states so that each of the memory elements is capable of storing more than one bit of information. In yet another embodiment, the memory material is programmable to at least four resistance states so that each of the memory elements is capable of storing at least two bits of information. Hence, the memory materials may have a range of resistance values providing for the gray scale storage of multiple bits of information.

The memory materials may be directly overwritable so that they can be programmed from any of their resistance states to any other of their resistance states without first having to be set to a starting state. Preferably, the same programming pulse or pulses may be used to program the memory material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

The memory material may be a phase change material. The phase-change materials may be any phase change memory material known in the art. Preferably, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Te, Ge and Sb. An example of a memory material which may be used is $Te_2Ge_2Sb_5$.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. Preferably, the transition metal may include Cr, Fe, Ni, Nb, Pd, Pt and mixtures or alloys thereof.

A second example of an elementally modified memory material is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically operated memory element, comprising:
   a first dielectric layer having an opening, said opening having a sidewall surface and a bottom surface;
   a conductive layer disposed over said sidewall surface;
   a second dielectric layer disposed over said conductive layer within said opening; and
   a programmable resistance material in electrical communication with said conductive layer wherein the total area of contact between said programmable resistance material and said conductive layer is less than 250,000 square Angstroms.

2. The memory element of claim 1, wherein said area of contact has a first dimension in a first direction which is less than 500 Angstroms and a second dimension in a second direction which is less than 500 Angstroms.

3. The memory element of claim 2, wherein said first direction is substantially perpendicular to said second direction.

4. The memory element of claim 1, wherein said total area of contact is less than 150,000 square Angstroms.

5. The memory element of claim 1, wherein said programmable resistance material is electrically coupled to a top surface of said conductive layer.

6. The memory element of claim 1, wherein said conductive layer is disposed over the bottom surface of said opening.

7. The memory element of claim 1, wherein said conductive layer comprises a conductive sidewall spacer.

8. The memory element of claim 1, wherein said conductive layer is cup-shaped.

9. The memory element of claim 1, wherein programmable resistance material is a phase-change material.

10. The memory element of claim 1, wherein said programmable resistance material comprises a chalcogen element.

11. A device, comprising:
    a first dielectric layer having an opening, said opening having a sidewall surface and a bottom surface;
    a conductive layer disposed over said sidewall surface;
    a second dielectric layer disposed over said conductive layer within said opening; and
    a chalcogenide material in electrical communication with said conductive layer wherein the total area of contact between said chalcogenide material and said conductive layer is less than 250,000 square Angstroms.

12. The device of claim 11, wherein said area of contact has a first dimension in a first direction which is less than 500 Angstroms and a second dimension in a second direction which is less than 500 Angstroms.

13. The device of claim 11, wherein said first direction is substantially perpendicular to said second direction.

14. The device of claim 10, wherein said total area of contact is less than 150,000 square Angstroms.

15. The device of claim 10, wherein said chalcogenide material is electrically coupled to a top surface of said conductive layer.

16. The device claim 10, wherein said conductive layer is disposed over the bottom surface of said opening.

17. The device of claim 10, wherein said conductive layer comprises a conductive sidewall spacer.

18. The device of claim 10, wherein said conductive layer is cup-shaped.

19. An electrically operated memory element, comprising:
- a substrate;
- a cup-shaped conductive layer having an open end facing away from said substrate;
- a dielectric material disposed over an inside surface of said cup-shaped conductive layer; and
- a programmable resistance material in electrical communication with said cup-shaped conductive layer, wherein the total area of contact between said programmable resistance material and said cup-shaped conductive layer is less than 250,000 square Angstroms.

20. The memory element of claim 19, wherein said area of contact has a first dimension in a first direction which is less than 500 Angstroms and a second dimension in a second direction which is less than 500 Angstroms.

21. The memory element of claim 20, wherein said first direction is substantially perpendicular to said second direction.

22. The memory element of claim 21, wherein said total area of contact is less than 150,000 square Angstroms.

23. The memory element of claim 19, wherein said programmable resistance material is electrically coupled to a top surface of said conductive layer.

24. The memory element of claim 17, wherein programmable resistance material is a phase-change material.

25. The memory element of claim 17, wherein said programmable resistance material comprises a chalcogen element.

26. A device, comprising:
- a substrate;
- a cup-shaped conductive layer having an open end facing away from said substrate;
- a dielectric material disposed over an inside surface of said cup-shaped conductive layer; and
- a chalcogenide material in electrical communication with said cup-shaped layer wherein the total area of contact between said memory material and said cup-shaped conductive layer is less than 250,000 square Angstroms.

27. The device of claim 26, wherein said area of contact has a first dimension in a first direction which is less than 500 Angstroms and a second dimension in a second direction which is less than 500 Angstroms.

28. The device of claim 27, wherein said first direction is substantially perpendicular to said second direction.

29. The device of claim 26, wherein said total area of contact is less than 150,000 square Angstroms.

30. The device of claim 26, wherein said chalcogenide material is electrically coupled to a top surface of said conductive layer.

* * * * *